(12) United States Patent
Deacon

(10) Patent No.: US 7,023,886 B2
(45) Date of Patent: Apr. 4, 2006

(54) WAVELENGTH TUNABLE OPTICAL COMPONENTS

(75) Inventor: David A. G. Deacon, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 994 days.

(21) Appl. No.: 10/005,992

(22) Filed: Nov. 8, 2001

(65) Prior Publication Data

US 2003/0086655 A1 May 8, 2003

(51) Int. Cl.
*H01S 3/10* (2006.01)

(52) U.S. Cl. .............................. 372/20; 372/33; 372/34; 372/64

(58) Field of Classification Search ....................... None
See application file for complete search history.

(56) References Cited

U.S. PATENT DOCUMENTS

| | | | | |
|---|---|---|---|---|
| 4,006,963 | A | 2/1977 | Baues et al. | 350/96 C |
| 4,582,390 | A | 4/1986 | Furuya | 350/96.12 |
| 4,896,325 | A | 1/1990 | Coldren | 372/20 |
| 5,182,665 | A | 1/1993 | O'Callaghan et al. | 359/95 |
| 5,212,745 | A | * 5/1993 | Miller | 385/25 |
| 5,253,314 | A | 10/1993 | Alferness et al. | 385/40 |
| 5,333,216 | A | 7/1994 | Sakata et al. | 385/28 |
| 5,504,772 | A | 4/1996 | Deacon et al. | 372/102 |
| 5,511,084 | A | 4/1996 | Amann | 372/20 |
| 5,581,572 | A | 12/1996 | Delorme et al. | 372/50 |

(Continued)

FOREIGN PATENT DOCUMENTS

GB 2 286 057 8/1995

OTHER PUBLICATIONS

S. Ura et al., "Electro–Optic Functional Waveguide Using New Polymer p–NAn–PVA for Integrated Photonic Devices", Jpn. J. Appl. Physics, vol. 31, (1992) pp. 1378–1381.

D.M. Adams et al., "Module–Packaged Tunable Laser and Wavelength Locker Delivering 40 mW of Fibre–Coupled Power on 34 Channels", Electronic Letters, May 24, 2001, vol. 37, No. 11, pp. 691–693.

H–F Liu et al., "Polymer Tunable Power Laser", IEEE Laser & Electro–Optics Society, LEOS 2001, 5 pages.).

P.–J. Rigole et al., "State–of–the–Art: Widely Tunable Lasers", *SPIE*, vol. 3001, pp. 382–393.

T. Kunii et al., "Wavelength Tunable Light Source", *OKI Technical Review 152* vol. 61, May 1995, pp. 89–92.

S.L. Woodward et al., "A DBR Laser Tunable by Resistive Heating", *IEEE,* vol. 4, No. 12, Dec. 1992, pp. 1330–1332.

K. Furuya et al., "A Novel Deposit/Spin Waveguide Interconnection (DSWI) for Semiconductor Integrated Optics", *IEEE,* vol. QE–18, No. 10, Oct. 1982, pp. 1783–1789.

C. Barrett et al., "Photoinscription of Channel Waveguides and Grating Couplers in Azobenzene Polymer Thin Films", *SPIE,* vol. 3006, pp. 441–449.

(Continued)

*Primary Examiner*—Leon Scott, Jr.
(74) *Attorney, Agent, or Firm*—Blakely, Sokoloff, Taylor & Zafman LLP

(57) ABSTRACT

Embodiments of a wavelength tunable optical coupler, integrated optical components, and lasers are disclosed. The tunable optical coupler, the integrated optical components, and the lasers include thermo-optic organic material that has an index of refraction which can quickly vary in response to changes in temperature. By controlling the temperature in the thermo-optic organic material through the use of heaters or coolers, the optical coupler, the integrated optical components, and the lasers can be quickly and selectively tuned over a broad range of wavelengths with high spectral selectivity.

60 Claims, 12 Drawing Sheets

U.S. PATENT DOCUMENTS

| | | | | |
|---|---|---|---|---|
| 5,621,828 | A | 4/1997 | Baets et al. | 385/14 |
| 5,732,102 | A | 3/1998 | Bouadma | 372/96 |
| 5,827,039 | A | 10/1998 | Gammerler | 385/14 |
| 6,002,823 | A | 12/1999 | Chandross et al. | 385/50 |
| RE36,710 | E | 5/2000 | Baets et al. | 385/14 |
| 6,084,050 | A * | 7/2000 | Ooba et al. | 528/42 |
| 6,293,688 | B1 * | 9/2001 | Deacon | 362/556 |
| 6,342,204 | B1 * | 1/2002 | Combe et al. | 424/49 |
| 6,373,872 | B1 * | 4/2002 | Deacon | 372/34 |
| 6,690,694 | B1 * | 2/2004 | Deacon | 372/29.02 |
| 2003/0086448 | A1 * | 5/2003 | Deacon | 372/20 |
| 2003/0086655 | A1 * | 5/2003 | Deacon | 385/50 |
| 2003/0231666 | A1 * | 12/2003 | Daiber et al. | 372/34 |
| 2004/0066806 | A1 * | 4/2004 | Deacon | 372/20 |

OTHER PUBLICATIONS

M–C Oh et al., "Polymeric Wavelength Filters with Polymer Gratings", *Applied Phys. Lett.,* vol. 72, No. 13, Mar. 30, 1998, pp. 1559–1561.

C. Manolatou et al., "High–Density Integrated Optics", *J. of Lightwave Tech.,* vol. 17, No. 9, Sep. 1999, pp. 1682–1692.

L. Eldada et al., "Integrated Multichannel OADM's Using Polymer Bragg Grating MZI's", *IEEE,* vol. 10, No. 10, Oct. 1998, pp. 1416–1418.

P–J Rigole et al., "114–nm Wavelength Tuning Range of a Vertical Grating Assisted Codirectional Coupler Laser with a Super Structure Grating Distributed Bragg Reflector", *IEEE,* vol. 7, No. 7, Jul. 1995, pp. 697–699.

K. Tada et al., "Temperature Compensated Coupled Cavity Diode Lasers", *Optical & Quantum Elect.,* 16, 1984, pp. 463–469.

T. Tanaka et al., "Hybrid Integrated External Cavity Laser Without Temperature Dependent Mode Hopping", *OFC '99,* WH7 1–3, pp. 146–148.

B. Broberg et al., "Integrated Widely Tunable Laser Modules", *ECIO '99,* 6 pages.

B. Broberg et al., "Widely Tunable Semiconductor Lasers", *IEEE,* 1998, pp. 151–152, pp. 137–139.

P–J. Rigole et al., "Access to 20 Evenly Distributed Wavelengths Over 100nm Using Only a Single Current Tuning in a Four–Electrode Monolithic Semiconductor Laser", *IEEE,* vol. 7, No. 11, Nov. 1995, pp. 1249–1251.

A.A. Saavedra et al., "Relative Intensity Noise and Linewidth Measurements of a Widely Tunable GCSR Laser", *IEEE,* vol. 10, No. 4, Apr. 1998, pp. 481–483.

A.A. Saavedra et al., "Amplitude and Frequency Modulation Characteristics of Widely Tunable GCSR Lasers", *IEEE,* vol. 10, No. 10, Oct. 1998, pp. 1383–1385.

I. Kim et al., "Broadly Tunable Vertical–Coupler Filtered Tensile–Strained InGaAs/InGaAsP Multiple Quantum Well Laser", *Applied Phys. Lett.,* vol. 64, No. 21, May 23, 1994, pp. 2764–2766.

R.C. Alferness et al., "Broadly Tunable InGaAsP/InP Laser Based on a Vertical Coupler Filter with 57nm Tuning Range", *Applied Phys. Lett.,* vol. 60, No. 26, Jun. 29, 1992, pp. 3209–3211.

W.M. Steffens et al., "Effect of Internal Reflections on Wavelength Access in Widely Tunable Laser Diodes", *IEEE,* vol. 34, No. 9, Sep. 1998, pp. 1698–1705.

A.A. Saavedra et al., "Amplitude and Frequency Modulation Characteristics of Widely Tunable GCSR Lasers", *IEEE,* vol. 10, No. 10, Oct. 1998, pp. 1383–1385.

Z.M. Chuang et al., "Enhanced Wavelength Tuning in Grating–Assisted Codirectional Coupler Filter", *IEEE,* vol. 5, No. 10, Oct. 1993, pp. 1219–1221.

M.C. Amann et al., "Widely Tunable Laser Diode with Tapered Index Perturbations for Reduced Internal Reflections and Improved Wavelength Access", *Electronics Lett.,* vol. 32, No. 3, Feb. 1, 1996, pp. 221–222.

M. Oberg et al., "74nm Wavelength Tuning Range of an InGaAsP/InP Vertical Grating Assisted Codirectional Coupler Laser with Rear Sampled Grating Reflector", *IEEE,* vol. 5, No. 7, Jul. 1993, pp. 735–738.

L. Eldada et al., "Thermally Tunable Polymer Bragg Grating OADM's", *OFC '99 100C,* Technical Digest Conf. Edition, Feb. 25, 1999, pp. 98–100.

L. Eldada et al., "Thermo–Optically Active Polymeric Photonic Components", *OFC '2000,* Technical Digest Series, Mar. 8, 2000, pp. 124–126.

* cited by examiner

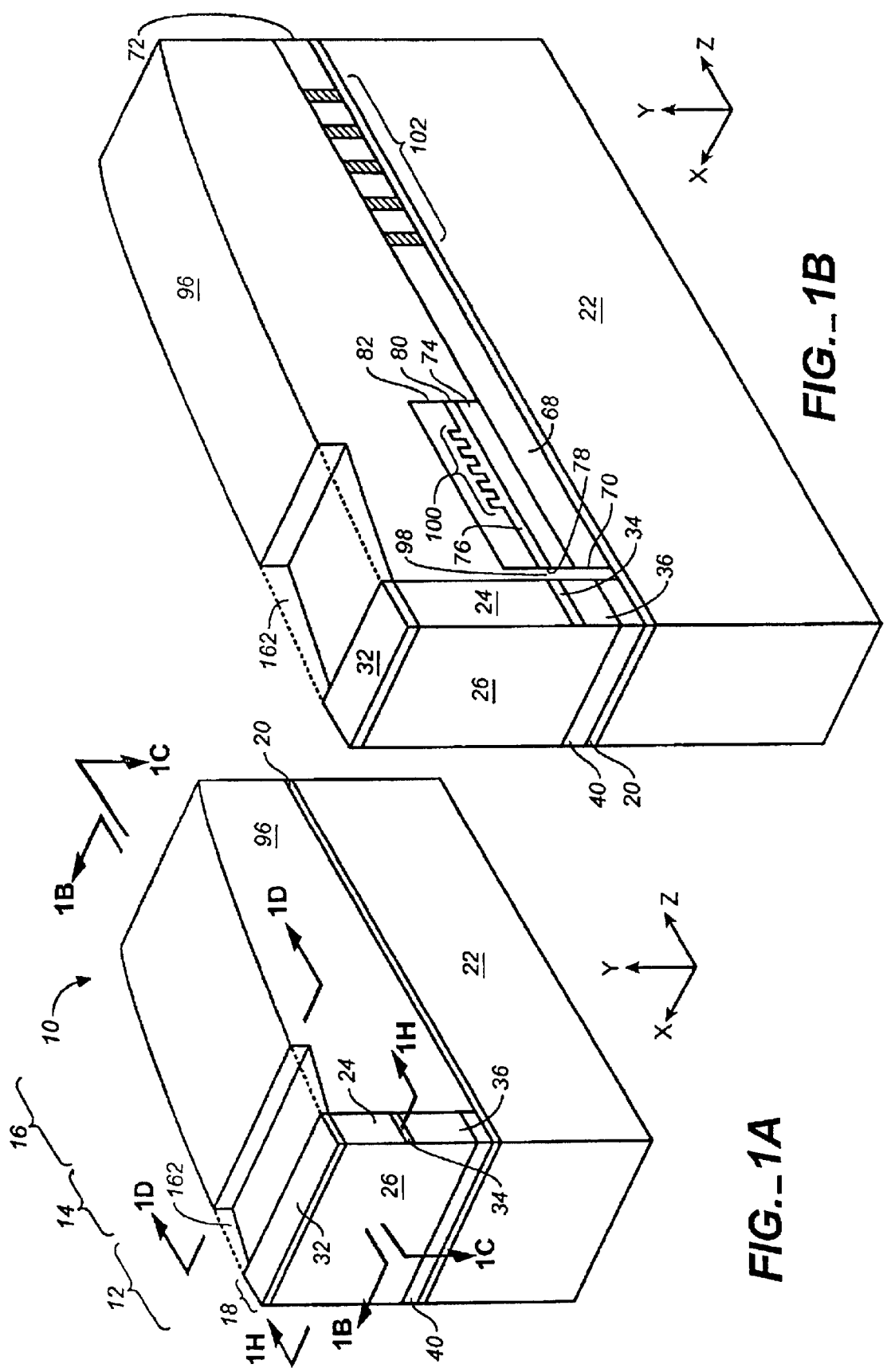

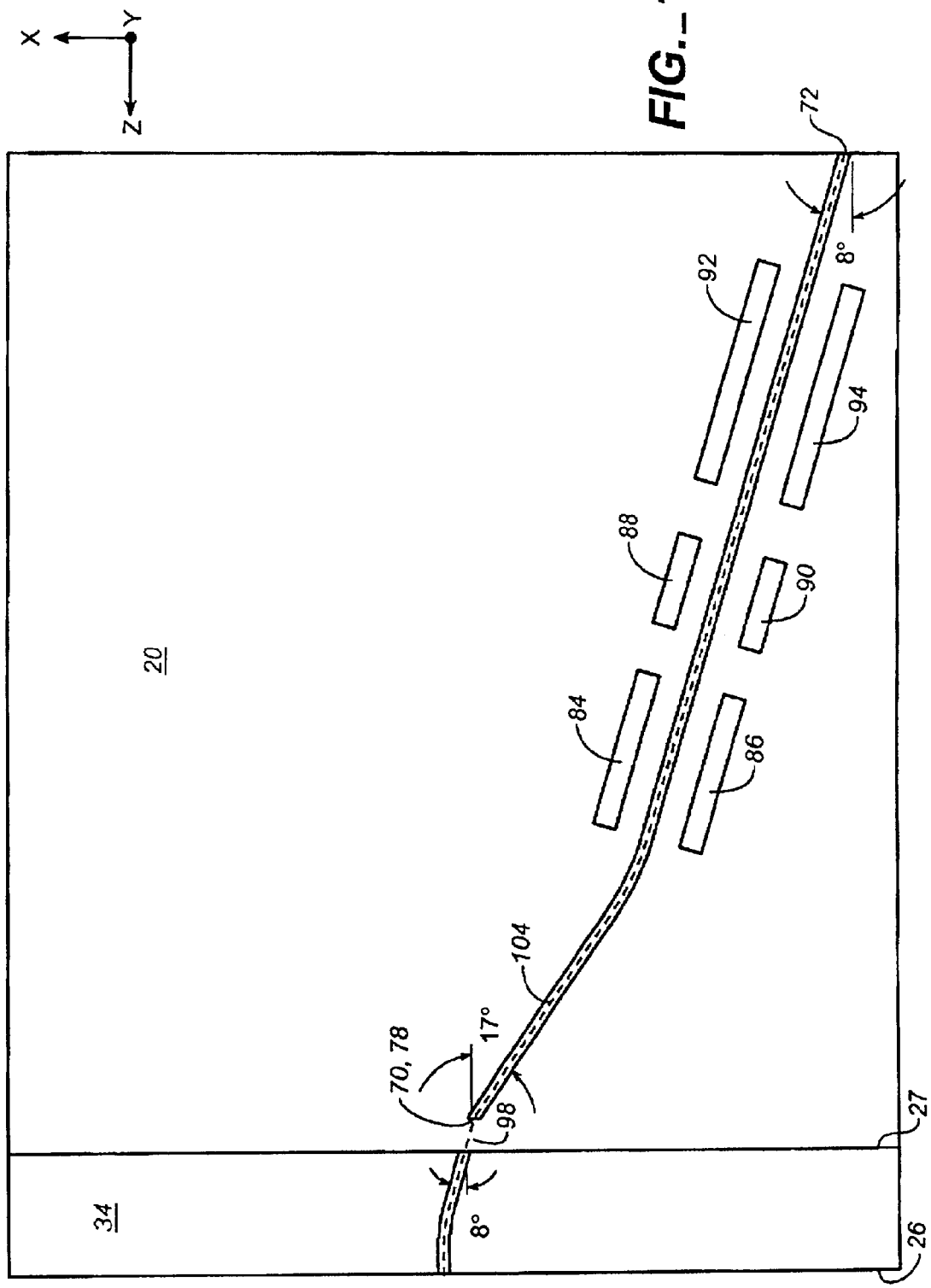

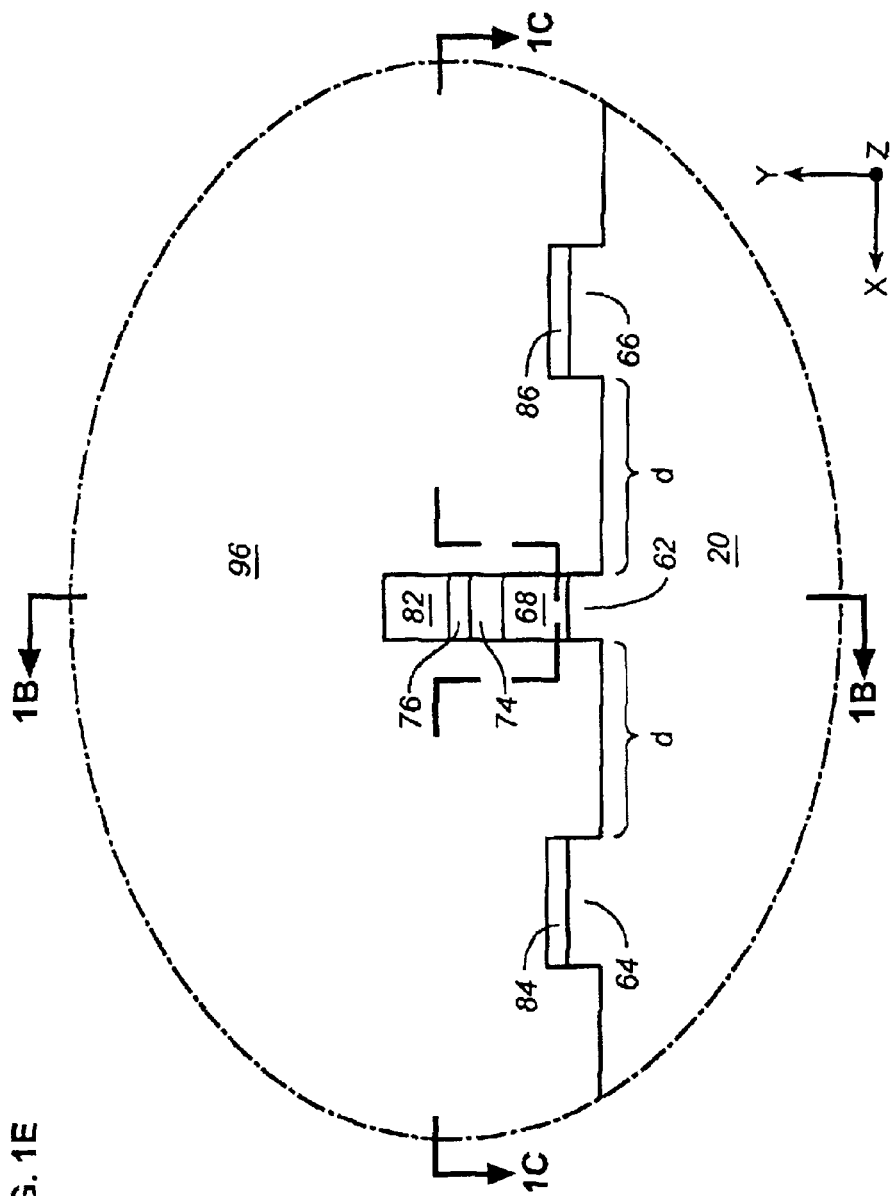
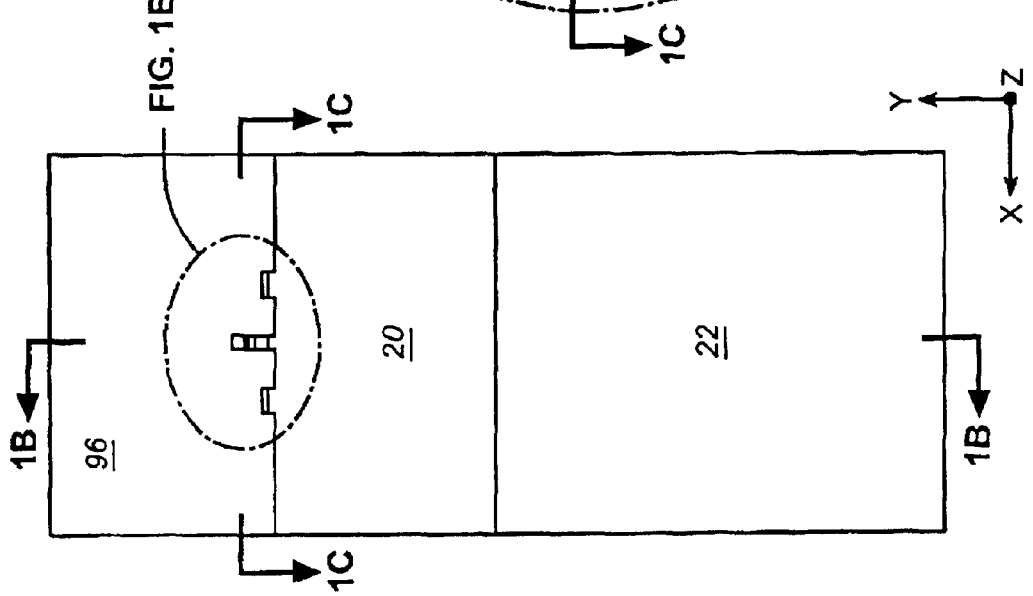

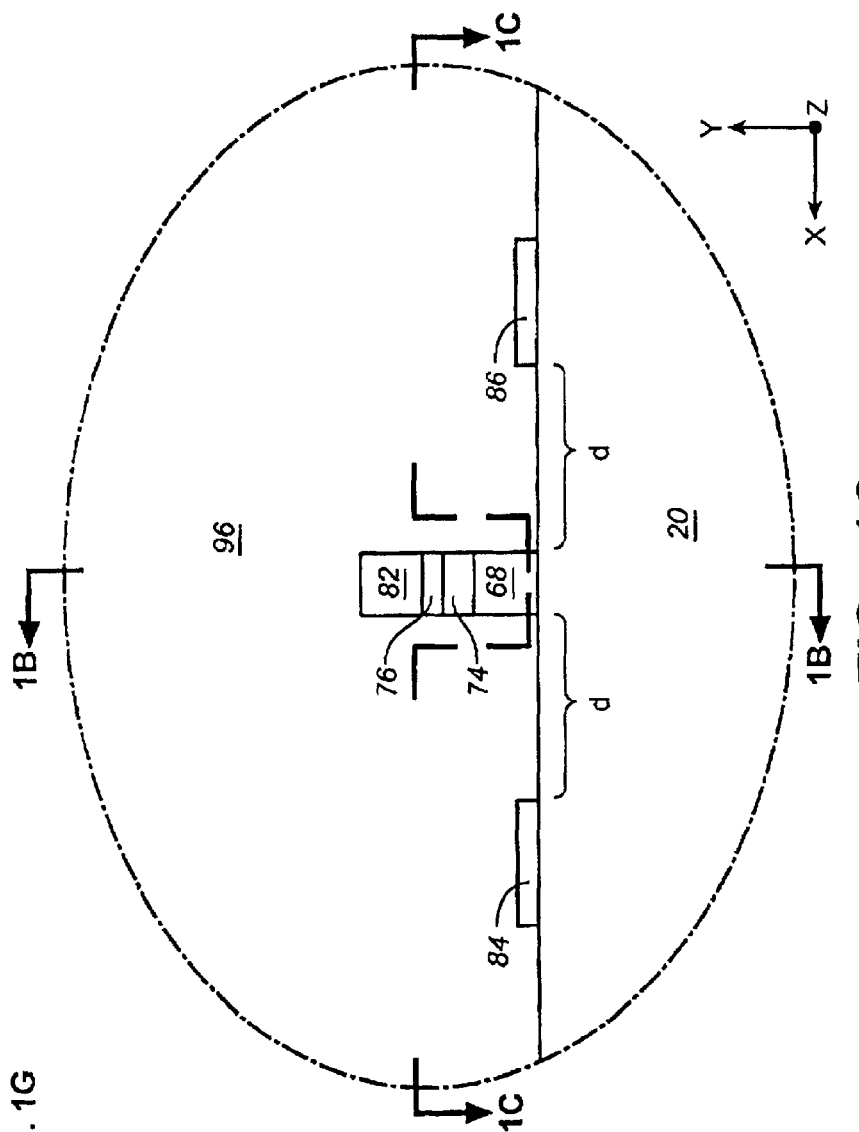
*FIG._1G*
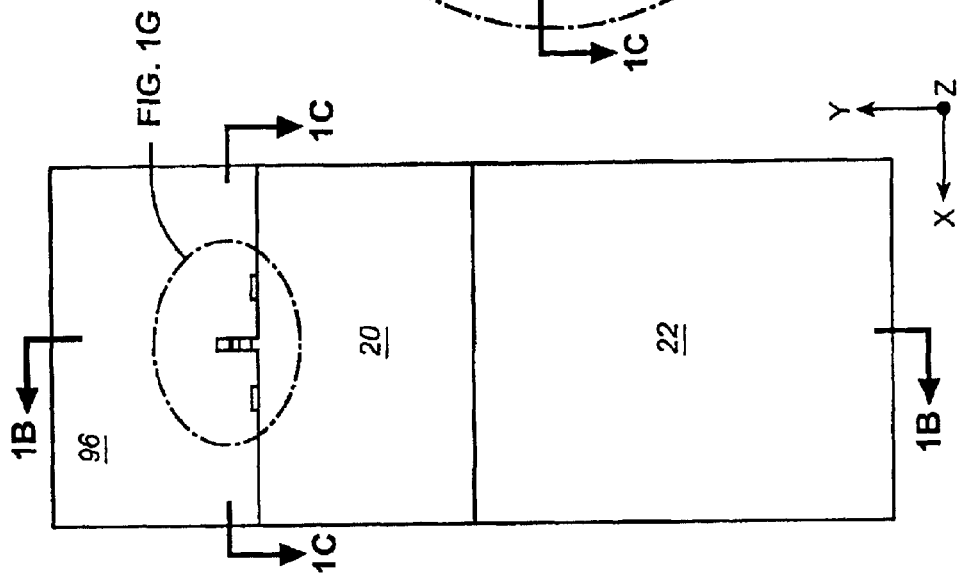
*FIG._1F*

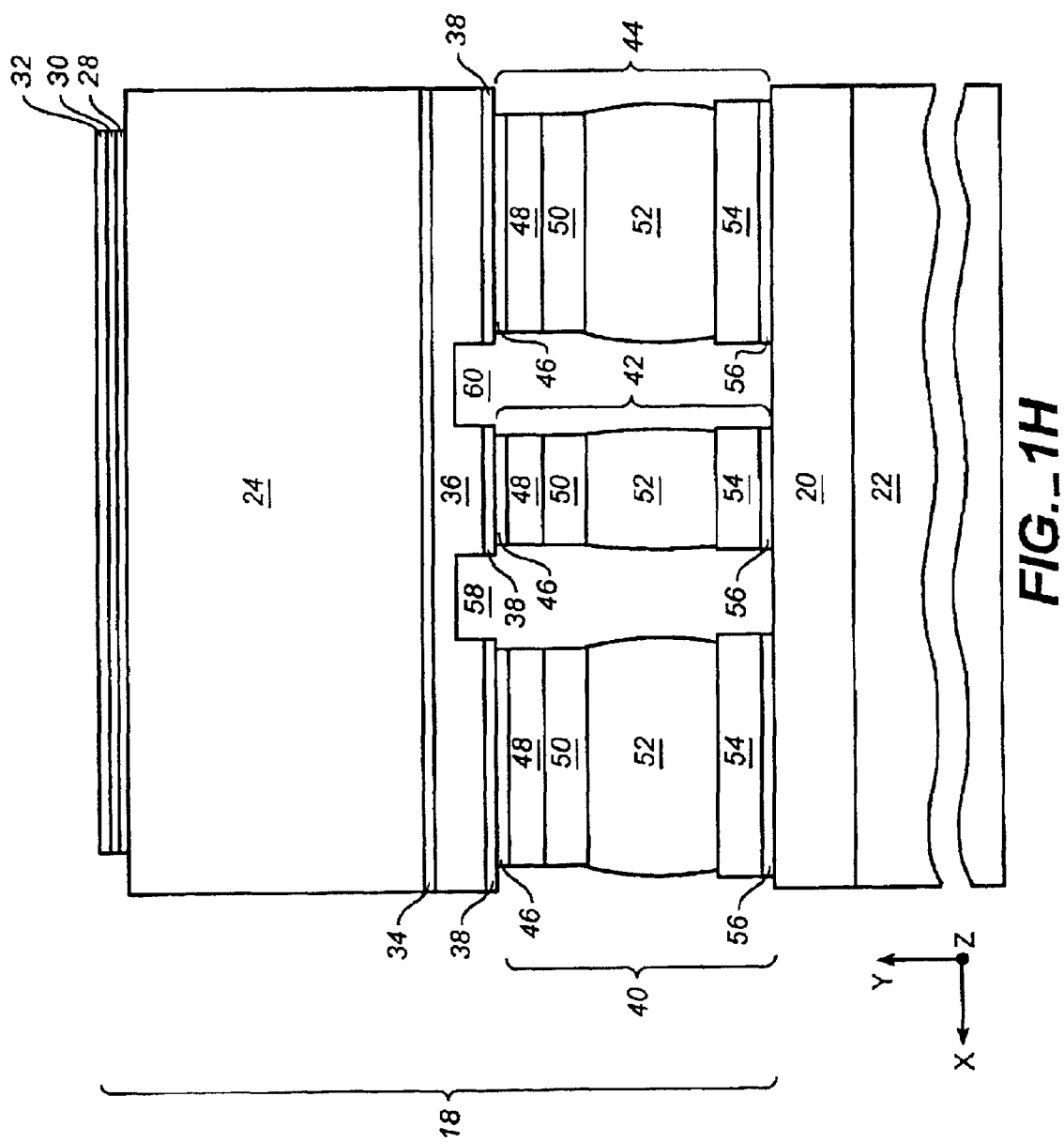
FIG._1H

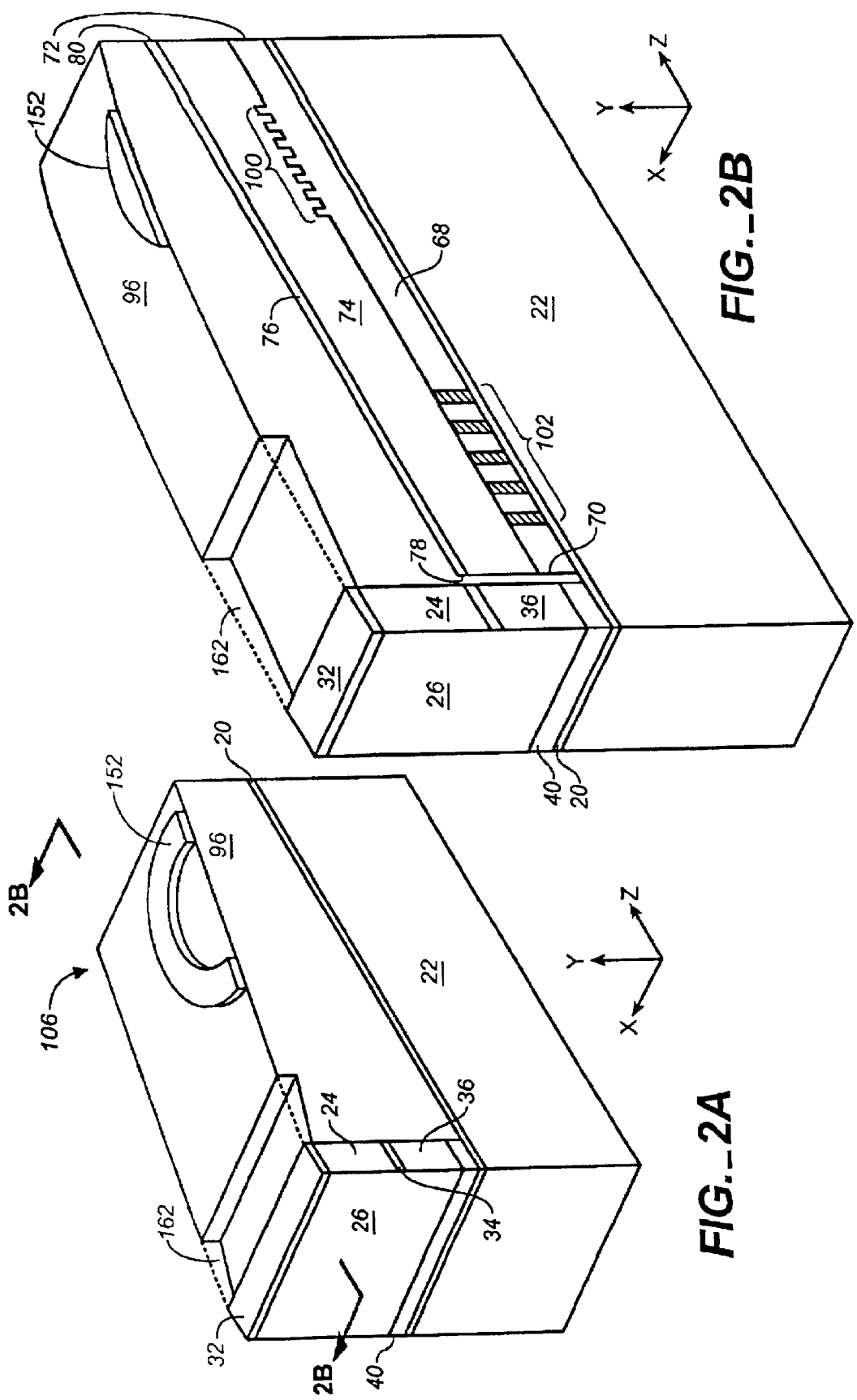

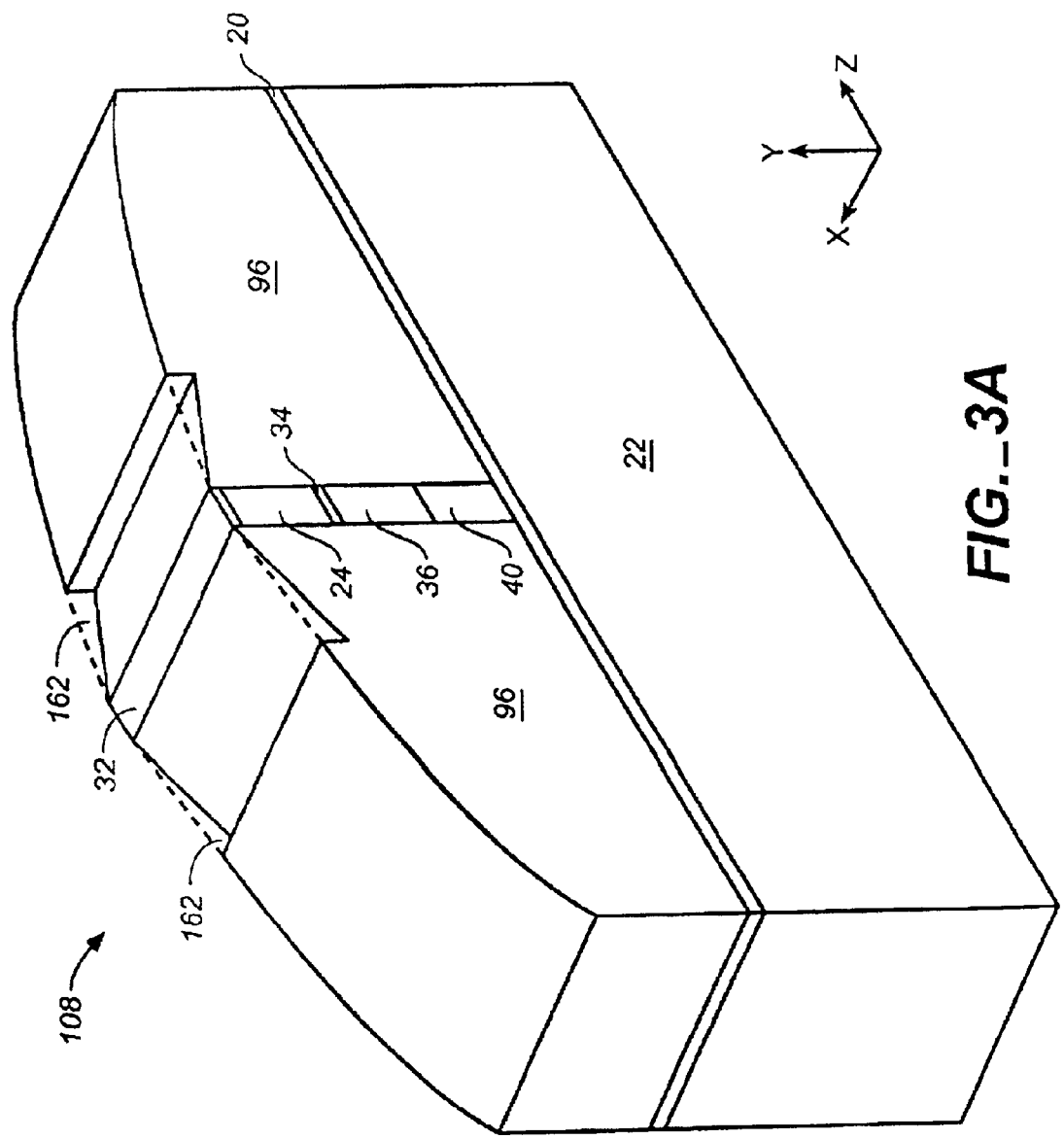
FIG._3A

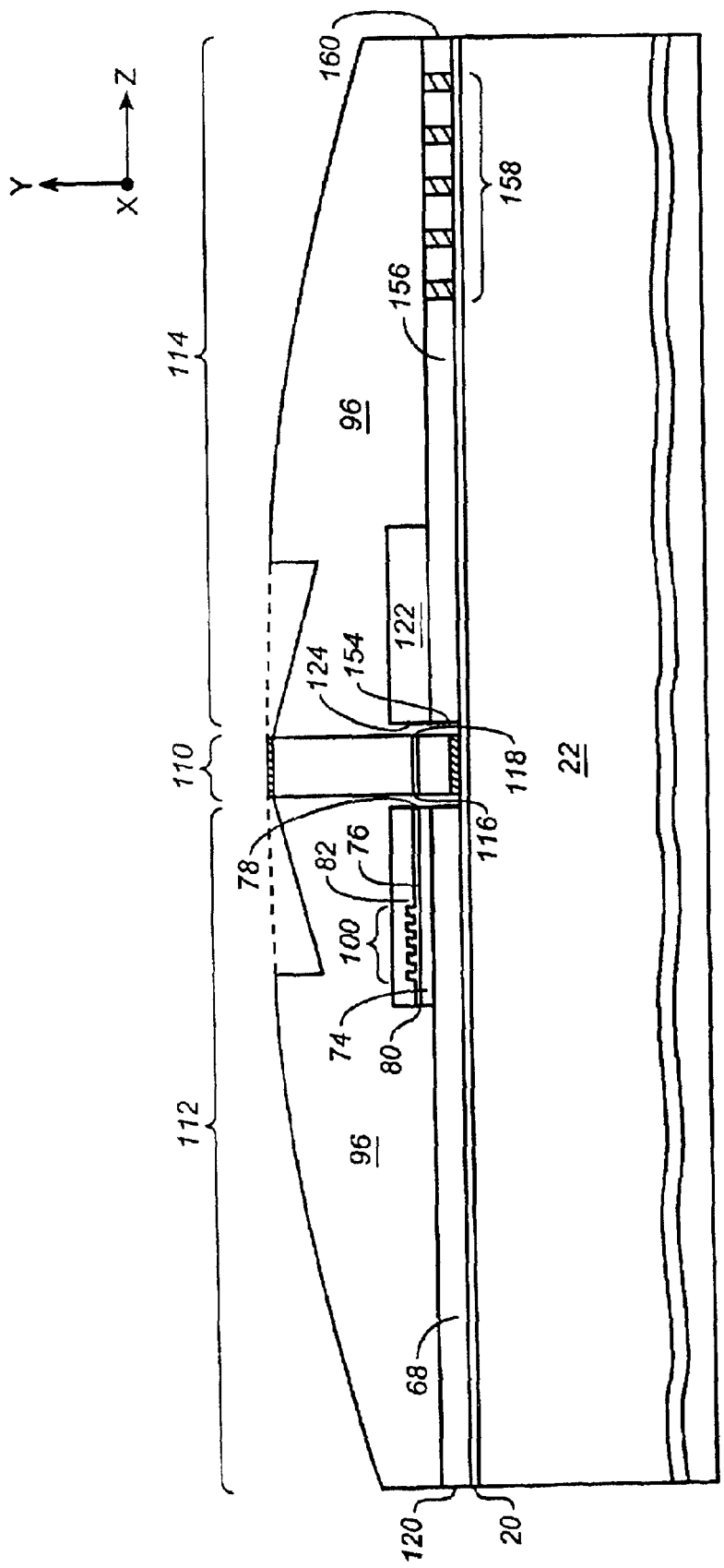
FIG._3B

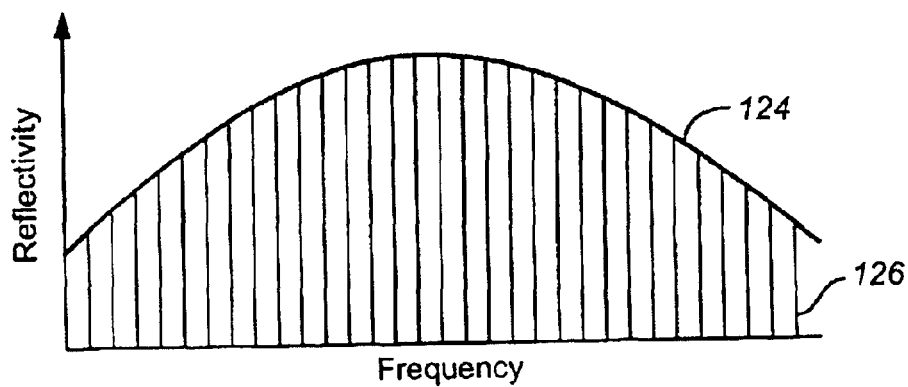
FIG._4
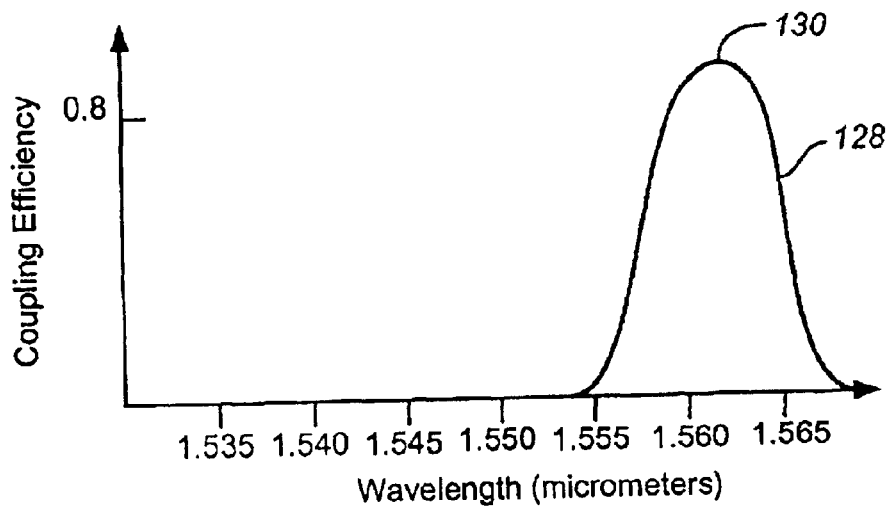
FIG._5A
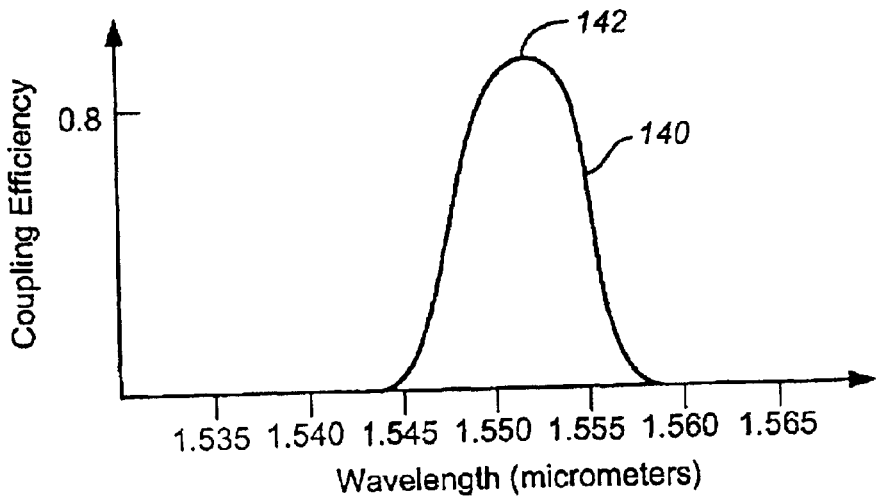
FIG._5B

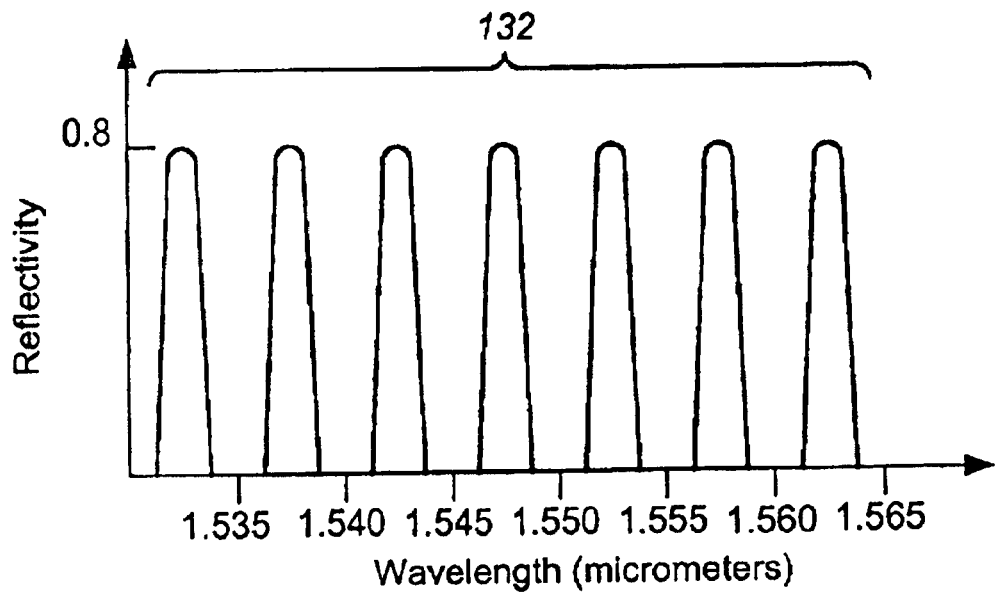
FIG._6A
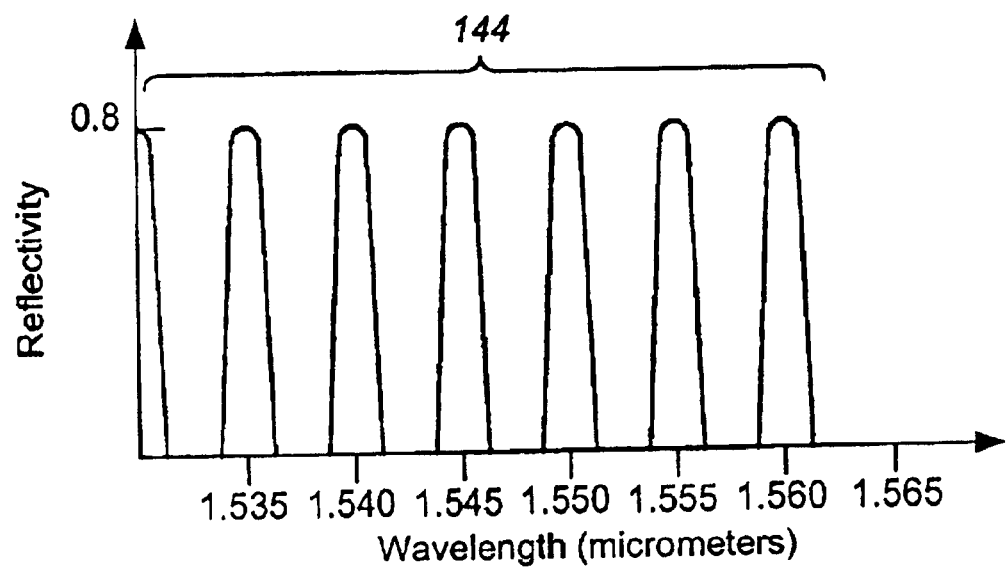
FIG._6B

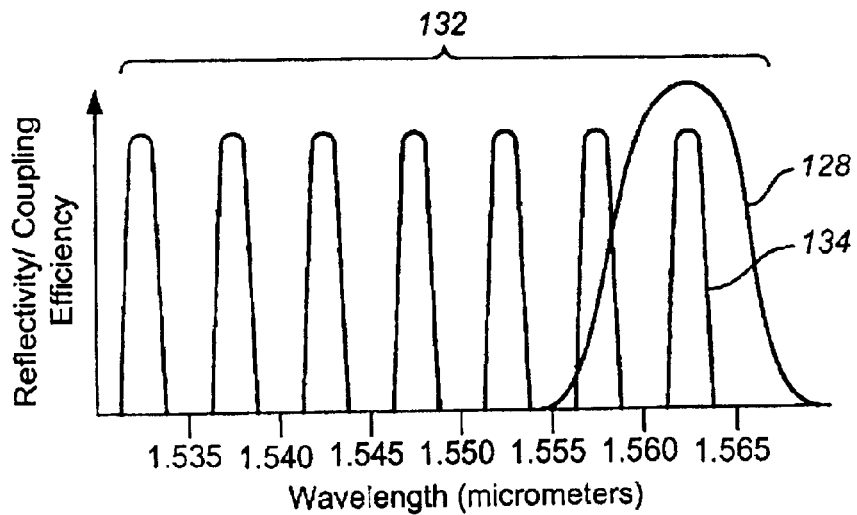
FIG._7A
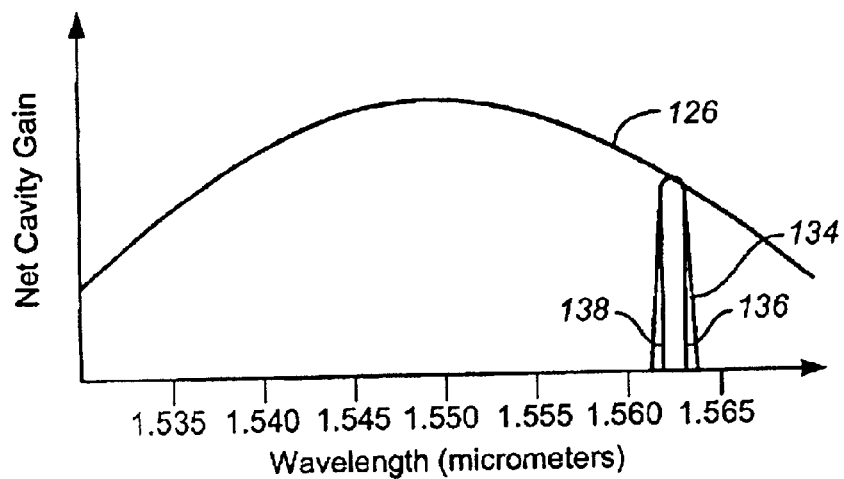
FIG._7B
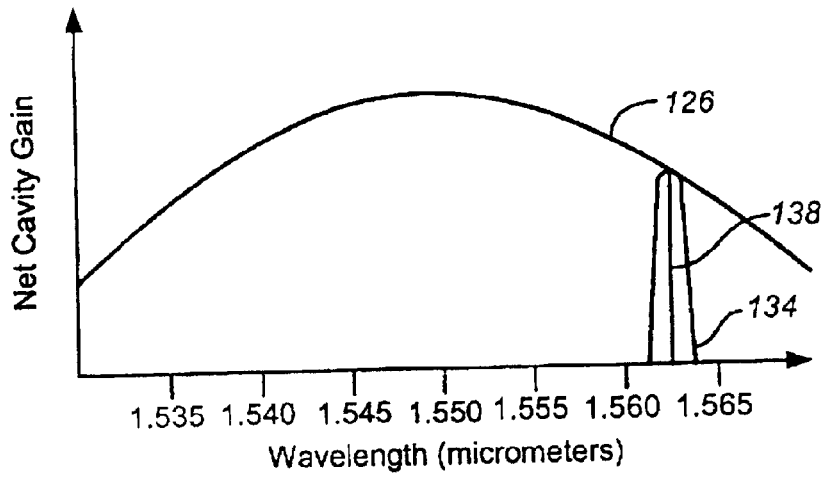
FIG._7C

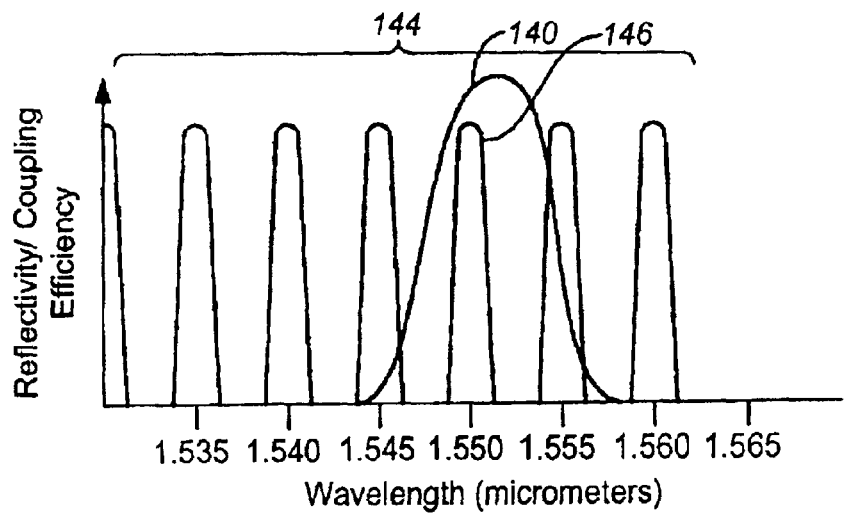
FIG._8A
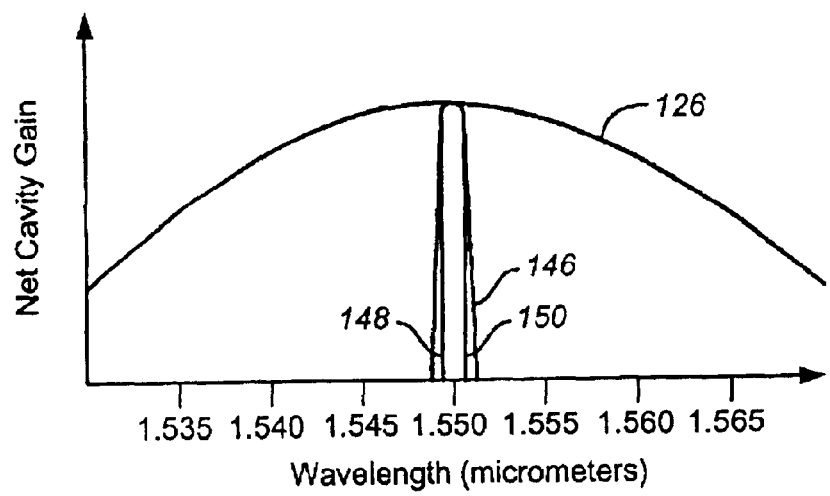
FIG._8B
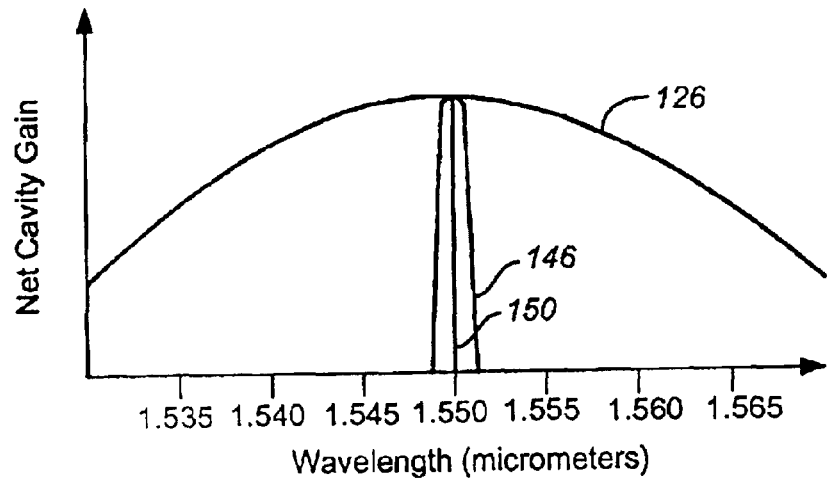
FIG._8C

WAVELENGTH TUNABLE OPTICAL COMPONENTS

BACKGROUND OF THE INVENTION

1. Field of the Invention

This invention relates to the field of optical devices that manipulate optical energy of tightly controlled optical wavelength, particularly for use in communication applications. More particularly, the invention relates to (a) integrated optical components which, when coupled to optical energy generating means, interact with optical energy of a specified wavelength and which can be tuned or switched to other specified wavelengths by thermal means and (b) lasers which produce optical energy of a specified wavelength and which can be tuned or switched to other specified wavelengths by thermal means.

2. Description of the Related Art

Over the past several years, there has been ever increasing interest in tunable lasers for use in optical communication systems, in general, and for use in dense wavelength division multiplexing (DWDM) applications, in particular. DWDM allows high bandwidth use of existing optical fibers, but requires components that have a broad tunable range and a high spectral selectivity. Such components should be able to access a large number of wavelengths within the S-band (1490–1525 nanometers), the C-band (1528–1563 nanometers), and the L-band (1570–1605 nanometers), each different wavelength separated from adjacent wavelengths by a frequency separation of 100 MHz, 50 MHz, or perhaps even 25 MHz, according to the system implementation.

The tunable monolithic wavelength selective coupler was one of the first components used in optical communication. The wavelength selective coupler consisted of a pair of asynchronous waveguides in combination with a phase matching coarse grating for coupling optical energy between the waveguides. Tuning was achieved by either injecting current into or applying a reverse bias voltage to the coupler thereby changing the coupled wavelength. Electrical contacts on the outer surface of the coupler were provided for this purpose, namely, for applying a potential to or for injecting current into the coupler. For a more detailed discussion of a tunable monolithic wavelength selective coupler, please refer to U.S. Pat. No. 5,253,314 by Alferness et al. entitled "Tunable Optical Waveguide Coupler" which is hereby incorporated by reference.

The distributed Bragg reflector (DBR) laser was one of the first tunable lasers used in optical communication. The DBR laser consisted of a semiconductor amplifier medium, defining an active section, and an optical waveguide. The optical waveguide included a portion without a grating that defined a phase control section and a portion in which a single grating of typically constant pitch ($\Lambda$) was formed which constituted a distributed Bragg reflector or, more simply, the Bragg section, that reflected light at the Bragg wavelength $\lambda_B$. Wavelength tuning of such a DBR laser was performed by transferring heat into the phase control section, the Bragg section, or both. The optical waveguide was defined by an organic layer which constituted a core with another organic confinement layer disposed both above and below the core. Wavelength tuning of such a DBR laser was performed by either injecting current or transferring heat into the phase control section, the Bragg section, or both. Injecting minority carriers made it possible to vary the refractive index of the waveguide and thus control the Bragg wavelength $\lambda_B$ by the equation $\lambda_B = 2n_{eff}\Lambda$ where $\Lambda$ is the pitch of the grating and $n_{eff}$ is the effective refractive index of the waveguide. Alternatively, a pair of heating resistance strips were disposed on opposite outer surfaces of the laser component at the phase control section, the Bragg section, or both. By independently controlling the voltages to the resistance strips, the temperature and hence the index of refraction of the organic layers that form the optical waveguide was controlled via the thermo-optical effect. Tuning by injecting current had the disadvantage of increasing optical loss and adding optical noise. Tuning by heating has the disadvantage of accelerating the aging of the device and thereby diminishing the useful life. Both options induce long-term drift in the Bragg wavelength thereby reducing reliability. For a more detailed discussion of a wavelength tunable DBR laser by heating, please refer to U.S. Pat. No. 5,732,102 by Bouadma entitled "Laser Component Having A Bragg Reflector of Organic Material, And Method of Making It" which is hereby incorporated by reference.

A grating assisted coupler with sampled rear reflector (GCSR) laser was another type of tunable laser that held great promise. The GCSR laser comprised of a semiconductor amplifier medium, a coupler section, a phase control section, and a reflector section. Electrodes were disposed on opposite outer surfaces of the GCSR laser for any or all of the coupler section, the phase control section, and the reflector section and wavelength tuning was performed by injecting current into any or all of the coupler section, the phase control section, or the reflector section. While providing a broad tuning range, wavelength tuning by injecting current causes considerable spectral line width broadening and a decrease in emitted power, both important criteria in DWDM applications. For a more detailed discussion of a wavelength tunable GCSR laser by injection current, please refer to U.S. Pat. No. Re. 36,710 by Baets et al. entitled "Integrated Tunable Optical Filter," to a paper by Rigole et al. entitled "Access to 20 Evenly Distributed Wavelengths Over 100 nm Using Only a Single Current Tuning in a Four Electrode Monolithic Semiconductor Laser," IEEE Photonics Technology Letters, Vol. 7, No. 11, Pages 1249–1251, November 1995, and to a paper by Rigole et al. entitled "State-of-the-art: Widely Tunable Lasers," SPIE, Vol. 3001, Pages 382–393, 1997, which are all hereby incorporated by reference.

SUMMARY OF THE INVENTION

Embodiments of novel tunable lasers and associated integrated optical components are disclosed which can quickly and repeatedly access a broad range of relevant wavelengths with high spectral selectivity yet without the problems associated with the prior art.

A first embodiment of the novel tunable laser includes a substrate that supports a gain means with an active emission section and a first and second aligned asynchronous waveguides. A first end of the first waveguide is adjacent to the active emission section and receives the optical energy produced by the active emission section. An optical coupler receives the optical energy on the first waveguide and couples substantially all of the optical energy at a coupling wavelength between the first and the second waveguides. Thermo-optical organic material is positioned with respect to the optical coupler to shift the coupling wavelength in response to changes in the temperature of the thermo-optical organic material associated with the optical coupler. Tuning of the laser may be achieved by changing the temperature in the thermo-optical organic material which has an index of refraction that varies in response to changes in temperature.

By varying the temperature of heaters or coolers in or on the thermo-optical organic material, a broad wavelength tuning range with high spectral selectivity is possible.

A second embodiment of the novel tunable laser includes a substrate that supports a gain means with an active emission section and a first and second aligned asynchronous waveguides. A first end of the first waveguide is adjacent to the active emission section and receives the optical energy produced by the active emission section. An optical coupler receives the optical energy on the first waveguide and couples substantially all of the optical energy at a coupling wavelength between the first and the second waveguides. A reflector receives the optical energy propagating along the second waveguide and reflects the optical energy if the coupling wavelength is one of a plurality of reflection wavelengths. Between the optical coupler and the reflector along a grating free-portion of the second waveguide, there may be a phase control section which can slightly shift the Fabry-Perot resonant cavity modes associated with the tunable laser. Thermo-optical organic material is disposed with respect to the optical coupler, the reflector, and the phase control section to shift the coupling wavelength, the plurality of reflection wavelengths, and the Fabry-Perot resonant cavity modes in response to changes in the temperature of the thermo-optical organic material associated with the optical coupler, the reflector, or the phase control section, respectively. Tuning of the laser may be achieved by changing the temperature in the thermo-optical organic material which has an index of refraction that varies in response to changes in temperature. By varying the temperature of heaters or coolers in or on the thermo-optical organic material associated with the optical coupler, the phase control portion, the reflector, or combinations thereof, a broad wavelength tuning range with high spectral selectivity is possible.

The thermo-optical organic material of the tunable laser is preferably selected so as to have a high coefficient of variation in refractive index as a function of temperature, the magnitude of which should be preferably greater than $1 \times 10^{-4}/°$ C. Examples of thermo-optical organic material used in the tunable laser and that exhibit these characteristics include polymers derived from methacrylate, siloxane, carbonate, styrene, cyclic olefin, or norbornene.

An integrated optical component is also disclosed for each embodiment of the tunable laser. Each integrated optical component includes all the functional elements associated with the respective embodiment of the tunable laser, but does not include the gain means that is typically fabricated from a different semiconductor material than the integrated optical component.

It should be observed that, except for the gain means, the tunable laser is fabricated using Si processing technology and only the gain means is of GaAs, InP, InGaAsP, or other exotic semiconductor materials which requires complex and sensitive processing technology, such as epitaxial growth and cleaving. The gain means is independently fabricated with a minimum of structure. Accordingly, the tunable laser is easy to manufacture, cost effective to manufacture, and results in high yield.

BRIEF DESCRIPTION OF THE DRAWINGS

Other objects and advantages of the invention will become apparent upon reading the following detailed description and upon reference to the accompanying drawings in which:

FIG. 1A is a right side elevational view of a first embodiment of a tunable laser accordance with the principals of this invention;

FIG. 1B is a right side elevational view along line 1B—1B in FIG. 1A;

FIG. 1C is a diagrammatic representation of a top view along the line 1C—1C in FIG. 1A which follows the optical path of the tunable laser;

FIG. 1D is a front view of a first embodiment of the heater stacks and the waveguides along the line 1D—1D in FIG. 1A;

FIG. 1E is a close up view of a portion of FIG. 1D;

FIG. 1F is a front view of a second embodiment of the heater stacks and the waveguides along the line 1F-F in FIG. 1A;

FIG. 1G is a close up view of a portion of FIG. 1F;

FIG. 1H is a detailed front view of the laser diode along the line 1H—1H shown in FIG. 1A;

FIG. 2A is a right side elevational view of a second embodiment of a tunable laser accordance with the principals of this invention;

FIG. 2B is a right side elevational view along the line 2B—2B in FIG. 2A;

FIG. 3A is a right side elevational view of a third embodiment of a tunable laser according with the principals of this invention;

FIG. 3B is a side view along the line 3B—3B in FIG. 3A;

FIG. 4 is a diagrammatic representation of the Fabry-Perot resonant cavity modes and the gain envelop associated with the tunable laser shown in FIG. 1;

FIG. 5A is a diagrammatic representation of the coupling spectrum associated with an optical coupler in the tunable laser shown in FIG. 1;

FIG. 5B is a diagrammatic representation of the coupling spectrum associated with the optical coupler in the tunable laser shown in FIG. 1 having been shifted in wavelength due to thermal tuning in the grating assisted coupler;

FIG. 6A is a diagrammatic representation of the reflection spectrum associated with the reflector in the tunable laser shown in FIG. 1;

FIG. 6B is a diagrammatic representation of the reflection spectrum associated with the reflector in the tunable laser shown in FIG. 1 having been shifted in wavelength due to thermal tuning in the reflector;

FIG. 7A is a diagrammatic representation of the superposition of the coupling spectrum associated with the optical coupler shown in FIG. 5A and the reflection spectrum associated with the reflector shown in FIG. 6A;

FIG. 7B is a diagrammatic representation of selected Fabry-Perot resonant cavity modes located within the selected reflector peak;

FIG. 7C is a diagrammatic representation of the selected Fabry-Perot resonant cavity modes shown in FIG. 7B having been shifted due to thermal tuning in the phase control section;

FIG. 8A is a diagrammatic representation of the superposition of the coupling spectrum associated with the thermally tuned optical coupler shown in FIG. 5B and the reflection spectrum associated with the thermally tuned reflector shown in FIG. 6B;

FIG. 8B is a diagrammatic representation of selected Fabry-Perot resonant cavity modes located within the selected reflection peak; and FIG. 8C is a diagrammatic representation of the selected Fabry-Perot resonant cavity modes shown in FIG. 8B having been shifted due to thermal tuning in the phase control section.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to FIG. 1A, there is illustrated a first embodiment of a laser 10 that is highly wavelength tunable and has high spectral selectivity. The tunable laser 10 includes a gain means 18 which provides optical energy, an optical coupler section 12 which couples optical energy of selected wavelengths between adjacent asynchronous waveguides, a phase control section 14 which slightly shifts the Fabry-Perot resonant cavity modes associated with the tunable laser 10, and a reflector section 16 which reflects optical energy dependent upon the wavelength of the optical energy.

Most generally, the gain means 18 provides sufficient optical energy to overcome the losses associated with the components that make up the tunable laser 10 and to create oscillation within the tunable laser 10. The gain means 18 includes a rear facet 26 and a front facet 27 (FIG. 1C). The rear facet 26, most preferably, has a highly reflective (HR) coating thereon, but may also have a partially reflective and partially transmissive coating thereon, depending on whether optical energy will be outputted from this facet.

Referring now to FIG. 1H, the gain means 18 has been flipped over and flip chip bonded to a cladding layer 20 which is grown on a substrate 22 of the tunable laser 10. The gain means 18 is a solid-state laser which is preferably a semiconductor diode laser. The gain means 18 may be a ridge laser or a buried hetero-structure with or without multiple quantum wells. As shown, the gain means 18 is a ridge laser that is preferably fabricated from InP so as to emit in the 1550 nm region or the 1310 nm region. The gain means 18 includes a substrate 24 of n-type InP and sequentially deposited on a major surface of the substrate 24 is an adhesion layer 28 typically formed of titanium, a diffusion barrier layer 30 typically formed of platinum, and a bonding layer 32 typically formed of gold. An active layer 34 of a semiconductor material, such as AlGaInP, that may have either quantum wells or strained quantum wells, is grown on the other major surface of the substrate 24 and provides the optical energy of the tunable laser 10. The dimensions of the active layer 34 are variable, but may typically be a fraction of a micron in the y direction (thickness) and at least a couple of microns in the x direction (width). The optical energy produced by the active layer 34 is typically a single transverse mode with a mode size at full width half maximum (FWHM) of approximately 0.6 microns in the y direction (height) and approximately 3 microns in the x direction (width). A cap layer 36 formed of p-type InP is grown on the active layer 34 and, on the cap layer 36, a contact layer 38 which acts as a Schottky barrier is grown.

A plurality of solder balls 40, 42, and 44 connect the gain means 18 to the cladding layer 20. Each solder ball includes a first adhesion layer 46 typically formed of titanium, a diffusion barrier layer 48 formed typically formed of platinum, a bonding layer 50 typically formed of gold, a solder ball 52 typically formed of 80% gold and 20% tin, a bonding layer 54 typically formed of gold, and a second adhesion layer 56 typically formed of chromium. Many alternative solder materials may also be used, to enable processing at different temperatures, as may be alternative metal layers. An external electrical contact (not shown) exists on the bonding layer 32 and the bonding layer 54 of the central solder ball 42 thereby enabling the active layer 34 to be fed with amplification current in the region of the optical mode. Trenches 58 and 60 are etched through the contact layer 38 and through most of the cap layer 36 on both sides of the central solder ball 42 which effectively bounds most of the generated optical energy to the active region 34 between the trenches 58 and 60.

During operation, the gain means 18 generates several hundred milli-watts of thermal power, the majority of which is generated in the active region 34 between the trenches 58 and 60, and this thermal power is dissipated through an efficient thermal flow through and beneath the gain means 18. Thermal power generated in the active region 34 is dissipated through the plurality of solder balls 40, 42, and 44, through the cladding layer 20 that is typically formed of silica, and into the substrate 22 that is typically formed of silicon. The substrate 22 is substantially thicker than the cladding layer 20 and acts as a heat reservoir for the tunable laser by maintaining a relatively constant temperature with a low thermal gradient. Preferably, the rise above ambient temperature in the gain means 18 is kept beneath 50° C. and, more preferably, beneath 10° C. A single or a plurality of heat sinks (not shown) may be disposed beneath the substrate 22 in order to aid in dissipating thermal power from, most importantly, the gain means 18, but also from the optical coupler section 12, the phase control section 14, and the reflector section 16, as the cladding layer 20 and the substrate 22 are common to the optical coupler section 12, the phase control section 14, and the reflector section 16. A thermal sensor (not shown) may also be disposed near the gain means 18 to control the heat sinks (not shown) and to thereby regulate the temperature in the gain means 18.

Referring now to FIGS. 1D and 1E, a first embodiment of the heaters and the waveguides associated with optical coupler section 12 are shown. Specifically, the cladding layer 20 in the optical coupler section 12 is etched to produce pedestal regions 62, 64, and 66. The pedestal regions 62, 64 and 66 have a height of approximately 1.5 µm. The pedestal region 62 has a width of approximately 3 µm and the pedestal regions 64 and 66 have a width of approximately 7 µm. A germanosilicate ($GeSiO_2$) layer is deposited on the cladding layer 20 and etched which defines a second waveguide 68 on the pedestal region 62. As best shown in FIG. 1B, the second waveguide 68 includes a first end 70 which has an anti reflection (AR) coating thereon to prevent back reflection into the second waveguide 68 and a second end 72 which has an AR coating thereon. Most preferably, the first end 70 is terminated to prevent optical energy not coupled to a first waveguide, discussed below, by an optical coupler, discussed below, from reflecting back along the second waveguide 68. The second waveguide 68 is between 1 to 3 µm thick, between 5 to 8 mm long, and can also be doped silica with nitrogen, lead, tin, phosphorous, boron, or combinations thereof. Referring again to FIG. 1E, a silica layer is then deposited on the second waveguide 68 and etched to form spacer layer 74. The spacer layer 74 may have a range of thickness from 0 to 5 µm and, in this embodiment, has a thickness of approximately 1.5 µm and can be silica doped with boron, phosphorous, fluorine, or combinations thereof. The index of refraction ($n_s$) of the spacer layer 74 should be approximately the same as the index of refraction ($n_{cl}$) of the cladding layer 20, and should be less than the index of refraction ($n_2$) of the second waveguide 68.

A high index layer preferably fabricated from silicon oxinitride (SiON) is deposited on the spacer layer 74 and etched which defines a first waveguide 76. The first waveguide 76 is aligned with the second waveguide 68 and the first waveguide 76 includes a first end 78 (FIG. 1B) and a second end 80 (FIG. 1B). The first end 78 is terminated to pass optical energy and is also aligned with that portion of the gain medium 34 that is between the trenches 58 and 60 so as to couple as much of the optical energy produced by the gain medium 34 as possible into the first waveguide 76. Most preferably, the second end 80 is terminated to prevent optical energy not coupled to the second waveguide 68 by an optical coupler, discussed below, from re-entering the first waveguide 76. The second end 80 may also have an AR coating that prevents back reflection of optical energy into the first waveguide 76. The first waveguide 76 is between 0.1 to 1 µm thick and approximately 1 mm long. The index of refraction ($n_1$) of the first waveguide 76 is greater than the index of refraction ($n_2$) of the second waveguide 68 so that the waveguides are asynchronous. Upon the first waveguide 76, a silica layer known as a cap layer 82 is deposited. The thickness of the cap layer 82 can be between 0.5 and 2.5 µm and is approximately 1.5 µm in this embodiment. In this embodiment, the second waveguide 68 is shown beneath the first waveguide 76. However, it is within the scope of this invention to have the second waveguide 68 above or beside the first waveguide 76.

Upon the pedestal regions 64 and 66, respectively, heaters 84 and 86 are disposed. The heaters 84 and 86 are chromium (Cr) in this embodiment, but may be of any conductive material. The heaters 84 and 86 are approximately 7 µm wide, between 0.05 to 0.1 µm thick, and approximately 1 mm in length. These heater dimensions are chosen to produce the desired heat output per unit length, and may be adjusted as is well known in the art to change the material, the heat production, and the longevity of the heaters. Electrical contacts and wires (both not shown) are provided to apply a potential to or for passing current through each heater. The total distance from the heaters 82 and 84 to the first and second waveguides 76 and 68 is the distance (d). The distance (d) is chosen so that (a) the optical mode of each waveguide experiences minimal absorption loss caused by the material of the heaters and (b) the temperature of the thermo-optical organic material, discussed below, disposed adjacent to the waveguides can be quickly and efficiently changed. In FIGS. 1D, 1E, 1F and 1G, the distance (d) is at least 12 µm. The heaters shown in FIG. 1 are resistive heaters, but this invention contemplates the use of thermoelectric heaters or coolers that employ the Peltier effect. Specifically, thermoelectric heaters or coolers that employ the Peltier effect may be disposed on the pedestal region 62 and 64, the cladding layer 20, or the substrate 22. Stated as simply as possible, thermoelectric heaters and coolers that employ the Peltier effect are semiconductor materials with dissimilar characteristics that are connected electrically in series and thermally in parallel so that two junctions are created, namely, a hot and a cold junction. If operating as a thermoelectric cooler, the cold junction should be located near the waveguides while the hot junction should be as close to the heat sinks (not shown) as possible. Similarly, if operating as a thermoelectric heater, the hot junction should be located near the waveguides while the cold junction should be as close to the heat sinks (not shown) as possible.

The phase control section 14 (FIG. 1A) and the reflector section 16 (FIG. 1A) have a heater and waveguide structure (not shown) similar to that shown in FIGS. 1D and 1E, except that there is no spacer layer 74, no first waveguide 76, and no cap layer 82. A pair of heaters 88 and 90 associated with the phase control section 14 and a pair of heaters 92 and 94 associated with the reflector section 16 are shown in FIG. 1C. Referring now to FIGS. 1D and 1E, a thermo-optical organic material 96 is applied preferably by spinning onto and over the heaters 84, 86, 88, 90, 92, and 94, the first and second waveguides 68 and 76, the cap layer 82, the spacer layer 74, and onto the cladding layer 20. The thermo-optical organic material 96 has a high coefficient of variation in its' refractive index as a function of temperature, the magnitude of which is preferably greater than $1 \times 10^{-4}/°$ C. The index of refraction of the thermo-optical organic material 96 is preferably close to or equal to the index of the layers 20, 74, or 82 at the normal operating temperature of the tunable laser 10, namely, the temperature from which the heaters must start heating the thermo-optical organic material 96. Many such polymers are available commercially including the materials groups methacrylate, siloxane, carbonate, styrene, cyclic olefin, and norbornene. It is useful to adjust the index of refraction of these materials by fluorination (replacing hydrogen molecules with fluorine molecules in the molecular formula of some of the polymer repeat units) as this has the added benefit of reducing the optical loss in the infrared. Many of these materials meet the optical specifications for the thermo-optical organic layer 96. A specific material may be chosen according to an optimization process of the secondary characteristics such as minimizing birefringence, residual stress, and chemical reactivity, while maximizing wetting, adhesion, working lifetime, and thermal resistance. The thickness of the thermo-optical organic material 96 is chosen such the thermo-optical organic material-air interface adds only minimal and preferably no optical loss to the optical performance of the tunable laser 10.

FIGS. 1F and 1G show a second embodiment of the heaters and the waveguides disposed associated with the optical coupler section 12. The second embodiment differs from the first embodiment in that the second embodiment does not include the pedestal regions 62, 64, and 66 which are found in the first embodiment. The removal of the pedestal regions makes the fabrication process for the tunable laser of the second embodiment simpler but also reduces the effective tuning range when compared to that of the first embodiment.

Referring now to FIG. 1B, the gain means 18 is flip chip bonded to the cladding layer 20 so as to couple as much optical energy from the active region 34 and into the first waveguide 76, as possible, but without introducing any parasitic reflections. Most preferably, the active region 34 between the trenches 58 and 60 is aligned with the first waveguide 76 along the y (thickness) and x (width) directions and the gap 98 (FIG. 1C) between front facet 27 of the gain means 18 and the first end 78 of the first waveguide 76 is minimized in order to minimize the divergence of the optical energy as the optical energy propagates between the front facet 27 and first end 78. Typically, the gap 98 along the z direction (FIG. 1C) is on the order of 5 microns.

An optical coupler 100 is formed in the top surface of the first waveguide 76. The optical coupler 100 shown in FIG. 1B is a co-directional grating assisted coupler that couples optical energy between the first waveguide 76 and the second waveguide 68. The optical coupler 100 consists of a constant pitch grating or an apodized grating with a base periodicity (Λ) between about 3 and about 30 µm. The constant pitched grating shown in this embodiment is formed using conventional photolithography and chemical etching to form periodic grooves in the top surface of the first waveguide 76 which are filed when the cap layer 82 is deposited. Alternatively, a grating layer (not shown) in the form of an oxynitride layer (not shown) may be deposited between the first waveguide 76 and the cap layer 82 and the grating is formed in the grating layer (not shown) using the photolithography and chemical etching process discussed above. The optical coupler 100 may be a UV written or an etched grating, either constant pitched or apodized, located either in or on the first waveguide 76, the spacer layer 74, the cap layer 82, the grating layer (not shown), or the second waveguide 68 so long as the optical coupler can efficiently couple optical energy between the first and second waveguides. The heaters 84 and 86 (FIGS. 1E, 1F, 1G, and 1H) associated with the optical coupler section 12 are disposed on either side of optical coupler 100 and the length of the heaters 84 and 86 exceeds the length of the optical coupler 100 so that the entire length of the optical coupler 100 can be maintained at a uniform temperature. The optical energy transferred from one waveguide to another in the optical coupler 100 occurs at a coupling wavelength λ given by:

$$\lambda = \Lambda(n_1 - n_2)$$

where $n_1$ and $n_2$ are the effective indices of refraction of the first and the second waveguides, respectively. The effective index is the index of refraction experienced by the optical mode propagating within the waveguide structure, and is related to the index of refraction of the core and surrounding layers through the shape of the optical mode. It is important to note, the relative wavelength selectivity, which is the important to single frequency operation, can be improved by increasing the length of optical coupler 100 and controlling the thickness of the first waveguide 76 and the cap layer 82.

A reflector 102 is fabricated in the second waveguide 68 by using ultraviolet exposure of a portion of the second waveguide 68. If the optical energy is outputted from the second end 72, the reflector 102 is preferably partially transmitting and partially reflecting at the operating wavelength. If the optical energy is outputted from the front facet 26, the reflector 102 is preferably highly reflecting with 90% or more reflectivity. The reflector 102 typically is a specialized Bragg grating of base periodicity from 0.2 to 0.6 microns, but with additional phase and amplitude structure periodically repeated with a period ($\Lambda_s$) from 50 to 500 μm, dependant on the material being written on or into, and the reflection wavelength desired. For example, if the material of the second waveguide were silica, then the base periodicity of the reflector 102 would be approximately 530 nanometers. Similarly, if the material of the second waveguide were silicon, then the base periodicity of the reflector 102 would be approximately 200 nanometers. Due to the periodic structure, the optical spectrum of the reflector 102 exhibits multiple reflection peaks, known as a comb of peaks, in the wavelength domain of individually defined amplitude and wavelength spacing. The separation between adjacent peaks in the comb, dλ, is given by:

$$d\lambda = \lambda^2 / [2 n_g \Lambda_s]$$

where $n_g$ is the effective group index. Basically, the separation between adjacent peaks in the comb is controlled by the period $\Lambda_s$ while the envelope containing the peaks depends on the grating modulation function inside one sampling period. The reflector 102 may be a UV written or an etched specialized Bragg grating, located either in, on, or adjacent to the second waveguide 68 so long as the optical spectrum of the reflector exhibits the comb of peaks discussed below. The heaters 92 and 94 (FIG. 1C) associated with the reflector section 16 are also disposed on both sides of the reflector 102 and the length of the heaters 92 and 94 exceed the length of the reflector 102 so that the entire length of the reflector 102 can be maintained at a uniform temperature. The heaters 88 and 90 (FIG. 1C) associated with the phase control section 16 are disposed on both sides of a portion of the second waveguide 68 between the optical coupler 100 and the reflector 102.

The heaters 84, 86, 88, 90, 92, and 94 must generate sufficient thermal power so that the thermo-optical organic material 96 can modify the optical performance of the optical coupler 100, the portion of the second waveguide 68 between the heaters 88 and 90, and the reflector 102 (collectively, Optical Elements) within a few milliseconds. The thickness of the thermo-optical organic material 96 disposed around the optical elements is important in determining the response time. If too thick, additional thermal power must be generated to change the index of refraction of the remaining thermo-optical organic material which does not modify the optical performance of the Optical Elements, but which increases the response time. If too thin, the thermo-optical organic material may overlap a smaller portion of the optical mode and may not be able to sufficiently modify an effective index in the Optical Elements. In this embodiment, the thickness of the thermo-optical organic material 96 is at least 20 microns. Similarly, the cladding layer 20 beneath the heaters provides a degree of thermal isolation between the substrate and the heaters so that a larger fraction of the thermal power generated by the heaters modifies the optical performance of the Optical Elements rather than dissipates to the substrate 22. Given the different purposes, the cladding layer 20 preferably has different thicknesses beneath the gain means and beneath the heaters.

Referring now to FIGS. 1A and 1B, the thermo-optical organic material 96 is applied after the gain means 18 has been aligned and bonded in place. An application means for the thermo-optical organic material 96 is selected to provide coverage without incorporating voids or bubbles. The thermo-optical organic material 96 therefore fills the gap 98 between the gain means and the waveguide facet, providing an advantageous index matching effect. To enable electrical connection to the n-contact 32 of the gain means 18, the thermo-optic organic material 96 is removed, preferably by reactive ion etching through a lithographically patterned mask, from a region above the gain means 18 leaving the slot structure 162.

Referring now to FIG. 1C, the optical path 104 of the tunable laser 10 is shown. In FIG. 1, optical energy propagates along the active region 34 between the trenches 58 and 60, the first waveguide 76, and the second waveguide 68 which collectively define the optical axis 104 within the tunable laser 10. The optical axis 104 is angled near the front facet 27 of the gain means 18, and near the second end 72 of the second waveguide 68 so that the optical axis 104 traverses the intracavity interfaces such as 27 and 78 and the extracavity interfaces such as 72 at a non-normal angle so as to prevent parasitic reflections from degrading the performance of the tunable laser 10. The second end 80 of the waveguide 76 is preferably inclined relative to the optical axis 104 to minimize parasitic reflection. The optical axis 104 is curved within the active region 34 so that the rear facet 26 of the gain means 18 forms one end and the reflector 102 (FIG. 1B) forms the other end of the laser cavity associated with the tunable laser 10. In order for the tunable laser 10 to lase, the gain associated with active layer 34 must be greater than losses associated with the gain means and the laser cavity. The losses associated with the laser cavity include, but are not limited to: the coupling losses between the front facet 27 and the first end 78, the coupling losses associated with the optical coupler 100, the losses propagating through the thermo-optical organic material 96 and the waveguides 68 and 76, the reflection losses associated with the reflectors 102 and 26, the reflections at the interfaces 27 and 70, and any other parasitic reflections. Each loss element in the laser cavity shown should be no larger than a few decibels (dB) and preferably smaller than 0.5 dB so that the collective single pass loss along the optical axis 104 of the laser cavity is no larger than about 5–20 decibels.

When the active layer 34 overcomes all of the losses associated with the gain means 18 and the laser cavity, the tunable laser 10 will lase along the optical axis 104. The output optical energy preferably exits the tunable laser 10 through the second end 72 of the second waveguide 68 but, alternatively, may exit through the rear facet 26 of the gain means 18. If the optical energy exits through the second end 72 of the second waveguide 68, then the second end 72 may have an antireflective coating thereon while the rear facet 26 has an HR coating thereon. Alternatively, if the optical energy exits through the rear facet 26 of the gain means 18, then the rear facet 26 has a partially reflective and partially transmissive coating.

Referring now to FIGS. 2A and 2B where like elements are designated with like numerals, a second embodiment of the tunable laser 106 is shown. The second embodiment of the tunable laser 106 is substantially similar to the first embodiment, but also differs from the first embodiment in several important respects. First, the optical coupler 100 is a reflective grating assisted coupler which both couples and reflects the optical energy between the first and second waveguides 76 and 68. The optical energy transferred from one waveguide to the other in the optical coupler 100 now occurs at a coupling wavelength λ given by the equation for a reflective coupler:

$$\lambda = \Lambda(n_1 + n_2)$$

where $n_1$ and $n_2$ are the effective indices of refraction of the first and the second waveguides, respectively, and $\Lambda$ is the base periodicity between about 0.2 and 0.6 μm. Second, the location of the optical coupler 100 and the reflector 102 have been juxtaposed with the optical coupler 100 near the second end 72 of the second waveguide 68 and the reflector 102 near the first end 70 of the second waveguide 68. The optical path 104 still passes sequentially through the active region 34, along the waveguide 76, through the coupler 100, and along the waveguide 68 to the reflector 102. Third, the spacer layer 74 spans the entire length of the second waveguide 68 and the first waveguide 76 spans the entire length of the spacer layer 74. Fourth, as the cap layer 82 is optional, it has been deleted from this embodiment. Fifth, the tunable laser 106 can also be tuned by passing current through heater strips 152 disposed on the outer surface of the thermo-optical organic material 96 or, alternatively, by heaters (not shown) within the thermo-optical organic material 96, as shown in FIG. 1.

As a further alternative, the optical coupler 100 may have a plurality of reflection peaks such as illustrated in FIG. 6A or 6B, with a slightly different peak-to-peak wavelength separation for use with the multipeaked reflector 102 as a vernier grating pair, allowing both slow tuning of the laser wavelength via simultaneous actuation of the two gratings, and rapid tuning of the laser wavelength via tuning of one grating relative to the other.

Referring now to FIGS. 3A and 3B where like elements are designated with like numerals, a third embodiment of the tunable laser 108 is shown. The tunable laser 108 includes a gain means 110, a grating assisted coupler section 112, and a reflector section 114. The gain means 110 is the laser chip described in conjunction with FIGS. 1A and 1B and includes a first facet 116 and a second facet 118 that are preferably antireflection coated. The optical path within the active region 34 may be straight and angled relative to the facets 116 and 118. The grating assisted coupler section 112 is similar to the optical coupler section 12 shown in FIG. 1 and wherein a second end 120 of the second waveguide 68 is a dielectric mirror or a metal coating. The grating assisted coupler section 112 is disposed adjacent to the first facet 116 such that the first end 78 is aligned with that portion of the active region 34 between the trenches 58 and 60 so as to couple as much of the optical energy produced by the active region 34 as possible into the first waveguide 76. The reflector section 114 is similar to the phase control section 14 and the reflector section 16 shown in FIG. 1. Further, in the reflector section 114, a first end 154 of a third waveguide 156 optimally includes a taper or a mode converter 122 for improving the coupling efficiency with the gain medium. The taper 122 includes a first end 124 which is adjacent to the second facet 118 of the gain means 110 such that a first end 124 of the taper 122 is aligned with that portion of the active region 34 between the trenches 58 and 60 so as to couple as much of the optical energy produced by the active region 34 as possible into the taper 122 and, hence, down to the third waveguide 156 and to a reflector 158. A second end 160 of the third waveguide 156 is preferably AR coated and the optical energy may be taken from either end 120 or 160.

The dynamic operation of the tunable laser 10 shown in FIG. 1 shall now be discussed under the assumption that all the heaters are off, unless otherwise noted. Amplification current supplied to the bonding layer 32 and the portion of the bonding layer 54 in electrical contact with the optical axis 104 in the active layer 34 causes population inversion in the active layer 34 and gain in the laser cavity of the tunable laser 10. When the round trip gain in the laser cavity of the tunable laser 10 exceeds the round trip losses, the tunable laser 10 will lase along the optical axis 104. The laser cavity of the tunable laser 10 will have a gain curve 124 and the Fabry-Perot resonant cavity modes 126 shown schematically in FIG. 4. Optical energy will propagate from that portion of the front facet 27 that produces the optical energy, namely, the active region 34 between trenches 58 and 60, through the gap 98, through the first end 78, and into the first waveguide 76. Since the optical path 104 near the front facet 27 and the front end 78 is angled, parasitic reflections should be minimized and most of the optical energy should propagate into the first waveguide 76. The optical coupler 100 will optically couple optical energy between the first and the second waveguide dependent on the wavelength associated with the optical energy. As shown in FIG. 5A, the optical coupler 100 has a spectral bandwidth 128. The spectral bandwidth 128 passes all of the optical energy at a coupling wavelength 130, progressively less optical intensity of the optical energy having wavelengths progressively distal from the coupling wavelength, and no optical intensity of the optical energy having wavelengths beyond a certain distance from coupling wavelength. The optical energy remaining on the first waveguide is attenuated at the second end 80 while the optically coupled optical energy propagates through the second waveguide 68 to the reflector 102. The reflector 102 reflects the optical energy if the wavelength associated with the optical energy is one of a plurality of reflection wavelengths and passes all other optical energy. The reflection spectrum of the reflector 132 is shown in FIG. 6A and, as shown in FIG. 6A, the reflector 102 generates the "comb of peaks" discussed in conjunction with FIG. 1B, namely, a comb shaped reflective spectrum 132 with a reflection peak at each reflection wavelength.

Referring now to FIG. 7A which is the superposition of the coupling spectrum in FIG. 5A and the reflection spectrum in FIG. 6A with the heaters off, the spectral bandwidth 128 acts as a filter to select a reflection peak 134 in the reflection spectrum 132. The tunable laser 10 will lase if there is a Fabry-Perot resonant cavity mode located within the range of wavelengths associated with the reflection peak 134 and the proper gain conditions exist. FIG. 7B shows the reflection peak 134 fitted within the gain curve 126 of the tunable laser 10 and the Fabry-Perot resonant cavity modes 136 and 138 located within the range of wavelengths associated with the reflection peak 134. The Fabry-Perot resonant cavity modes 136 and 138 are both of approximately the same height within the reflection peak 134 shown in FIG. 7B and the wavelength spacing between the wavelength associated with each Fabry-Perot resonant cavity mode is small. If the active layer 34 does not have a preference between either Fabry-Perot resonant cavity mode 136 and 138, then the lasing wavelength of the tunable laser 10 will jump between the Fabry-Perot resonant cavity modes 136 and 138 in what is known as "mode hopping." To overcome this problem and as shown in FIG. 7C, current is supplied to the heaters 88 and/or 90 in the phase control portion 14, thereby heating the heaters 88 and/or 90 and thereby heating and changing the index of refraction of the thermo-optical organic material 96 adjacent to the second waveguide 68 thereby slightly shifting the Fabry-Perot resonant cavity modes 136 and 138 so that only a single Fabry-Perot resonant cavity mode 138 is within the selected reflection peak 134. As a result, more mode hopping is eliminated. The tunable laser 10 will then lase at the wavelength associated with the Fabry-Perot resonant cavity mode 138 and the optical intensity of the output optical energy of the tunable laser 10 is related to the height of the Fabry-Perot resonant cavity mode 138 shown in FIG. 7C.

The dynamic operation of the tunable laser 10 shown in FIG. 1 shall now be explained with the assumption that all the heaters are on unless otherwise noted. Most generally, as current is supplied to the heaters, the temperature associated with the heaters increases which, in turn, increases the temperature of the thermo-optical organic material 96 near the Optical Elements. Increasing the temperature of the thermo-optical organic material 96 near the Optical Elements changes the index of refraction of the thermo-optical organic material 96 near the Optical Element. The change of the index of refraction of the thermo-optical organic material 96 near the Optical Elements modifies the optical performance of the Optical Elements, as discussed below. Applying current to the heaters 84 and/or 86 associated with the optical coupler section 12 increases the temperature of the heaters 84 and/or 86, increases the temperature and hence changes the index of refraction of the thermo-optical organic material 96 near the optical coupler 100 and results in the optical coupler 100 having a spectral bandwidth 140 and a coupling wavelength 142 shifted to shorter wavelengths, as shown in FIG. 5B. Similarly, applying current to the heaters 92 and/or 94 associated with the reflector section 16 increases the temperature of the heaters 92 and/or 94, increases the temperature and hence changes the index of refraction of the thermo-optical organic material 96 near the reflector 102, and results in the reflector 102 having the reflective spectrum 144 shifted to shorter wavelengths, as shown in FIG. 6B. Referring to FIG. 6B, the reflection wavelengths of the reflective spectrum 144 are shown as 1.535, 1.540, 1.545, 1.550, 1.555, and 1.560 µm.

Referring now to FIG. 8A which is the superposition of the coupling spectrum in FIG. 5B and the reflection spectrum in FIG. 6B with the heaters on, the spectral bandwidth 140 acts as a filter to select a reflection peak 146 in the reflection spectrum 144. The tunable laser 10 may lase if there is a Fabry-Perot resonant cavity mode located within the range of wavelengths associated with the reflection peak 146 and the proper conditions exist. FIG. 8B shows the reflection peak 146 fitted within the gain curve 126 of the tunable laser 10 and the Fabry-Perot resonant cavity modes 148 and 150 located within the range of wavelengths associated with the reflection peak 146. The Fabry-Perot resonant cavity modes 148 and 150 are both of approximately the same height within the reflection peak 146 shown in FIG. 8B and the wavelength spacing between the wavelength associated with each Fabry-Perot resonant cavity mode is small. If the active layer 34 does not have a preference between either Fabry-Perot resonant cavity mode 148 and 150, then the lasing wavelength of the tunable laser 10 will mode hop between the Fabry-Perot resonant cavity modes 148 and 150. To overcome this problem and as shown in FIG. 8C, current is supplied to the heaters 88 and/or 90 in the phase control portion 14, thereby heating the heaters 88 and/or 90 and thereby heating and changing the index of refraction of the thermo-optical organic material 96 adjacent to the second waveguide 68 thereby slightly shifting the Fabry-Perot resonant cavity modes 148 and 150 so that only a single Fabry-Perot resonant cavity mode 150 is within the selected reflection peak 146, eliminating the mode hopping. Therefore, the lasing wavelength of the tunable laser 10 will be the wavelength that is associated with the Fabry-Perot resonant cavity mode 150 and optical intensity of the output optical energy of the tunable laser 10 is related to the height of the Fabry-Perot resonant cavity mode 150 shown in FIG. 8C. Note that with respect to the height of the Fabry-Perot resonant cavity mode 138 shown in FIG. 7C, the height of the Fabry-Perot resonant cavity mode 150 shown in FIG. 8C is greater which indicates that the optical intensity of the output optical energy of the tunable laser 10 is greater when lasing at the Fabry-Perot resonant cavity mode 150 shown in FIG. 8C, than at the Fabry-Perot resonant cavity mode 138 shown in FIG. 7C.

To select small variations in lasing wavelength, a small variation in the temperature of the coupler 100 is accomplished by adjusting the current through the heaters 84 and/or 86, while also varying the temperature of the reflector 102 by adjusting the current through the heaters 92 and/or 94. The rates of current adjustment are selected so that the reflection peak 146 and the coupling wavelength 142 both shift to the desired wavelength or operation, and the Fabry-Perot mode is adjusted as described above. To select large variations in lasing wavelength, a larger variation of the temperature of the coupler 100 is made without changing the temperature of the reflector 102 so that a different peak of the spectrum 144 is selected by the spectral bandwidth 140.

In the alternative case that the coupler 100 has a multi-peaked spectrum, the above discussion still holds, with the addition of the vernier effect between the two gratings. The vernier effect is obtained when both the coupler 100 and the reflector 102 have multipeaked spectra with a first peak separation for the coupler and a second peak separation for the reflector, the second peak separation being close to but different from the first by an amount larger than the spectral bandwidth. In this case, a small relative tuning of the coupler 100 relative to the reflector 102 can result in the selection of a new wavelength more widely separated from the original wavelength.

While the invention has been described with respect to the presently preferred embodiments, it will be appreciated by those skilled in the art that modification and changes can be made to the tunable laser of the present invention without departing from its spirit or essential characteristics. Accordingly, all modifications or changes that come within the meaning and range of equivalency of the claims are to be embraced within their scope.

What is claimed is:

1. A tunable laser comprising:
   a gain means with an active emission section which generates optical energy;
   a first and a second aligned asynchronous waveguides extending from the gain means, the first waveguide having a first end adjacent to the active emission section for receiving the optical energy generated by the active emission section;
   a substrate supporting the first waveguide, the second waveguide, and the gain means;
   an optical coupler positioned to provide optical coupling between the first and the second waveguides at a coupling wavelength where the first and the second waveguides are substantially transparent to the optical energy at the coupling wavelength;
   a reflector positioned to reflect the optical energy propagating along the second waveguide if the optical energy has a wavelength that is one of a plurality of reflection wavelengths;
   thermo-optical organic material having an index of refraction that varies in response to changes in temperature and positioned to shift the coupling wavelength in response to changes of temperature in the thermo-optical organic material; and
   means for changing the temperature in the thermo-optical organic material positioned to shift the coupling wavelength.

2. The tunable laser of claim 1 further comprising thermo-optical organic material positioned to shift the plurality of reflection wavelengths and means for changing the temperature in the thermo-optical organic material positioned to shift the plurality of reflection wavelengths.

3. The tunable laser of claim 2 wherein the second waveguide includes a grating-free portion interposed between the optical coupler and the reflector, the grating-free portion including a phase control section.

4. The tunable laser of claim 3 further comprising thermo-optical organic material positioned in proximity to the phase control section and means for changing the temperature in the thermo-optical organic material positioned in proximity to the phase control section.

5. The tunable laser of claim 4 wherein the thermo-optical organic material has a coefficient of refractive index variation as a function of temperature, the magnitude of which exceeds $1\times10^{-4}/^\circ$ C.

6. The tunable laser of claim 4 wherein the thermo-optical organic material is selected from the group comprising a polymer derived from methacrylate, a polymer derived from siloxane, a polymer derived from carbonate, a polymer derived from styrene, a polymer derived from cyclic olefin, and a polymer derived from norbornene.

7. The tunable laser of claim 4 wherein the means for changing the temperature in the thermo-optical organic material is selected from the group comprising a resistive heater, a thermoelectric heater, and a thermoelectric cooler.

8. The tunable laser of claim 1 wherein the optical coupling means comprises longitudinally periodic grooves formed on a surface of the first waveguide.

9. The tunable laser of claim 1 wherein the optical coupler is selected from the group comprising a co-directional grating assisted coupler and a reflective grating assisted coupler.

10. An integrated optical component comprising:
    a substrate supporting a first and a second aligned asynchronous waveguides;
    an optical coupler positioned to provide optical coupling between the first and the second waveguides at a coupling wavelength where the first and the second waveguides are substantially transparent to optical energy at the coupling wavelength;
    a reflector positioned to reflect optical energy propagating along the second waveguide if the optical energy has a wavelength that is one of a plurality of reflection wavelengths;
    thermo-optical organic material having an index of refraction that varies in response to changes in temperature and positioned to shift the coupling wavelength in response to changes of temperature in the thermo-optical organic material; and
    means for changing the temperature in the thermo-optical organic material positioned to shift the coupling wavelength.

11. The integrated optical component of claim 10 further comprising thermo-optical organic material positioned to shift the plurality of reflection wavelengths and means for changing the temperature in the thermo-optical organic material positioned to shift the plurality of reflection wavelengths.

12. The integrated optical component of claim 11 wherein the second waveguide includes a grating-free portion interposed between the optical coupler and the reflector, the grating-free portion including a phase control section.

13. The integrated optical component of claim 12 further comprising thermo-optical organic material positioned in proximity to the phase control section and means for changing the temperature in the thermo-optical organic material positioned in proximity to the phase control section.

14. The integrated optical component of claim 13 wherein the thermo-optical organic material has a coefficient of refractive index variation as a function of temperature, the magnitude of which exceeds $1\times10^{-4}/^\circ$ C.

15. The integrated optical component of claim 13 wherein the thermo-optical organic material is selected from the group comprising a polymer derived from methacrylate, a polymer derived from siloxane, a polymer derived from carbonate, a polymer derived from styrene, a polymer derived from cyclic olefin, and a polymer derived from norbornene.

16. The integrated optical component of claim 13 wherein the means for changing the temperature in the thermo-optical organic material is selected from the group comprising a resistive heater, a thermoelectric heater, and a thermoelectric cooler.

17. The integrated optical component of claim 10 wherein the optical coupling means comprises longitudinally periodic grooves formed on a surface of the first waveguide.

18. The integrated optical component of claim 10 wherein the optical coupler is selected from the group comprising of a co-directional grating assisted coupler and a reflective grating assisted coupler.

19. The integrated optical component of claim 10 further comprising a gain means with an active emission section which generates optical energy, the first waveguide having a first end adjacent to the active emission section for receiving the optical energy generated by the active emission section.

20. An optical coupler comprising:
a substrate supporting a first and a second aligned asynchronous waveguides, the first and the second aligned asynchronous waveguides having a first and a second end;
optical coupling means positioned to provide optical coupling between the first and the second waveguides at a coupling wavelength where the first and the second waveguides are substantially transparent to the optical energy at the coupling wavelength;
thermo-optical organic material having an index of refraction that varies in response to changes in temperature and positioned to shift the coupling wavelength in response to changes of temperature in the thermo-optical organic material;
means for changing the temperature in the thermo-optical organic material positioned to shift the coupling wavelength;
the first end of the first waveguide being terminated to pass optical energy and the second end of the first waveguide being terminated to prevent optical energy not coupled to the second waveguide by the optical coupling means from re-entering the first waveguide; and
the first end of the second waveguide being terminated to prevent optical energy not coupled to the first waveguide by the optical coupling means from reflecting back along the second.

21. The optical coupler of claim 20 wherein the thermo-optical organic material has a coefficient of refractive index variation as a function of temperature, the magnitude of which exceeds $1 \times 10^{-4}/^\circ$ C.

22. The optical coupler of claim 20 wherein the thermo-optical organic material is selected from the group comprising a polymer derived from methacrylate, a polymer derived from siloxane, a polymer derived from carbonate, a polymer derived from styrene, a polymer derived from cyclic olefin, and a polymer derived from norbornene.

23. The optical coupler of claim 20 wherein the optical coupling means comprises longitudinally periodic grooves formed on a surface of the first waveguide.

24. The optical coupler of claim 23 wherein the longitudinally periodic refractive grooves have a period which is in the range of 1–50 μm.

25. The optical coupler of claim 20 wherein the optical coupling means is selected from the group comprising a co-directional grating assisted coupler and a reflective grating assisted coupler.

26. The optical coupler of claim 20 wherein the means for changing the temperature in the thermo-optical organic material is selected from the group comprising a resistive heater, a thermoelectric heater, and a thermoelectric cooler.

27. A tunable laser comprising:
a gain means with an active emission section which generates optical energy, the active emission section having a first and a second facet;
a substrate supporting the gain means and a first and a second aligned asynchronous waveguides, the first and the second aligned asynchronous waveguides having a first and a second end;
optical coupling means positioned to provide optical coupling between the first and the second waveguides at a coupling wavelength where the first and the second waveguides are substantially transparent to the optical energy at the coupling wavelength;
thermo-optical organic material having an index of refraction that varies in response to changes in temperature and positioned to shift the coupling wavelength in response to changes of temperature in the thermo-optical organic material;
means for changing the temperature in the thermo-optical organic material positioned to shift the coupling wavelength;
the first end of the first waveguide being adjacent to the first facet of the active emission section and the second end of the first waveguide being terminated to prevent optical energy not coupled to the second waveguide by the optical coupling means from re-entering the first waveguide; and
the first end of the second waveguide being terminated to prevent optical energy not coupled to the first waveguide by the optical coupling means from reflecting back along the second waveguide.

28. The tunable laser of claim 27 wherein the second end of the second waveguide is terminated to reflect optical energy back along the second waveguide.

29. The tunable laser of claim 28 further comprising:
a third waveguide supported by the substrate and having a first and a second end, the first end of the third waveguide adjacent to the second end of the active emission section, the second end being terminated to prevent optical energy from reflecting back along the third waveguide;
a reflector positioned to reflect optical energy propagating along the third waveguide if the optical energy has a wavelength that is one of a plurality of reflected wavelengths;
thermo-optical organic material positioned to shift the plurality of reflection wavelengths; and
means for changing the temperature of the thermo-optical organic material positioned to shift the plurality of reflection wavelengths.

30. The tunable laser of claim 29 wherein the thermo-optical organic material has a coefficient of refractive index variation as a function of temperature, the magnitude of which exceeds $1 \times 10^{-4}/^\circ$ C.

31. The tunable laser of claim 29 wherein the thermo-optical organic material is selected from a group comprising a polymer derived from methacrylate, a polymer derived from siloxane, a polymer derived from carbonate, a polymer derived from styrene, a polymer derived from cyclic olefin, and a polymer derived from norbornene.

32. The tunable laser of claim 29 wherein the optical coupling means comprises longitudinally periodic grooves formed on a surface of the first waveguide.

33. The tunable laser of claim 32 wherein the longitudinally periodic refractive grooves have a period which is in the range of 1–50 μm.

34. The tunable laser of claim 27 wherein the optical coupling means is selected from the group comprising of a co-directional grating assisted coupler and a reflective grating assisted coupler.

35. The tunable laser of claim 27 wherein the means for changing the temperature in the thermo-optical organic material is selected from the group comprising a resistive heater, a thermoelectric heater, and a thermoelectric cooler.

36. A tunable laser comprising:
a gain means with an active emission section which generates optical energy;
a first and a second aligned asynchronous waveguides extending from the gain means, the first waveguide having a first end adjacent to the active emission section for receiving the optical energy generated by the active emission section;
a substrate supporting the first waveguide, the second waveguide, and the gain means;
a reflective grating assisted coupler providing reflective optical coupling between the first and the second waveguides at a coupling wavelength where the first and the second waveguides are substantially transparent to the optical energy at the coupling wavelength; and
a reflector positioned to reflect the optical energy on the second waveguide if the optical energy has a wavelength that is one of a plurality of reflection wavelengths.

37. The tunable laser of claim 36 further comprising means to inject current into the first waveguide and the second waveguide.

38. The tunable laser of claim 36 further comprising:
thermo-optical organic material having an index of refraction that varies in response to changes in temperature and positioned to shift the coupling wavelength in response to changes of temperature in the thermo-optical organic material; and
means for changing the temperature in the thermo-optical organic material positioned to shift the coupling wavelength.

39. The tunable laser of claim 38 further comprising thermo-optical organic material positioned to shift the plurality of reflection wavelengths and means for changing the temperature in the thermo-optical organic material positioned to shift the plurality of reflection wavelengths.

40. The tunable laser of claim 39 wherein the second waveguide includes a grating-free portion interposed between the reflective grating assisted coupler and the reflector, the grating-free portion including a phase control section.

41. The tunable laser of claim 40 further comprising thermo-optical organic material positioned in proximity to the phase control section and means for changing the temperature in the thermo-optical organic material positioned in proximity to the phase control section.

42. The tunable laser of claim 41 wherein the thermo-optical organic material has a coefficient of refractive index variation as a function of temperature, the magnitude of which exceeds $1 \times 10^{-4}/°$ C.

43. The tunable laser of claim 41 wherein the thermo-optical organic material is selected from the group comprising a polymer derived from methacrylate, a polymer derived from siloxane, a polymer derived from carbonate, a polymer derived from styrene, a polymer derived from cyclic olefin, an a polymer derived from norbornene.

44. The tunable laser of claim 36 wherein the reflective grating assisted coupler provides reflective optical coupling between the first and the second waveguides at a plurality of coupling wavelengths where the first and the second waveguides are substantially transparent to the optical energy at each of the coupling wavelength.

45. An integrated optical component comprising:
a substrate supporting a first and a second aligned asynchronous waveguides;
a reflective grating assisted coupler providing reflective optical coupling between the first and the second waveguides at a coupling wavelength where the first and the second waveguides are substantially transparent to the optical energy at the coupling wavelength; and
a reflector positioned to reflect the optical energy on the second waveguide if the optical energy has a wavelength that is one of a plurality of reflection wavelengths.

46. The integrated optical component of claim 45 further comprising means to inject current into the first waveguide and the second waveguide.

47. The integrated optical component of claim 45 further comprising:
thermo-optical organic material having an index of refraction that varies in response to changes in temperature and positioned to shift the coupling wavelength in response to changes of temperature in the thermo-optical organic material; and
means for changing the temperature in the thermo-optical organic material positioned to shift the coupling wavelength.

48. The integrated optical component of claim 45 further comprising a gain means with an active emission section which generates optical energy, the first waveguide having a first end adjacent to the active emission section for receiving the optical energy generated by the active emission section.

49. The integrated optical component of claim 45 further comprising thermo-optical organic material positioned to shift the plurality of reflection wavelengths and means for changing the temperature in the thermo-optical organic material positioned to shift the plurality of reflection wavelengths.

50. The integrated optical component of claim 49 wherein the second waveguide includes a grating-free portion interposed between the reflective grating assisted coupler and the reflector, the grating-free portion including a phase control section.

51. The integrated optical component of claim 50 further comprising thermo-optical organic material positioned in proximity to the phase control section and means for changing the temperature in the thermo-optical organic material positioned in proximity to the phase control section.

52. The integrated optical component of claim 51 wherein the thermo-optical organic material has a coefficient of refractive index variation as a function of temperature, the magnitude of which exceeds $1 \times 10^{-4}/°$ C.

53. The integrated optical component of claim 51 wherein the thermo-optical organic material is selected from a group comprising a polymer derived from methacrylate, a polymer derived from siloxane, a polymer derived from carbonate, a polymer derived from styrene, a polymer derived from cyclic olefin, and a polymer derived from norbornene.

54. The integrated optical component of claim 45 wherein the plurality of reflective wavelengths has a first regular spacing, and the reflective grating assisted coupler provides reflective optical coupling between the first and the second waveguides at a plurality of coupling wavelengths with a second regular spacing slightly different from the first regular spacing.

55. The integrated optical component of claim 45 wherein the reflective grating provides reflective optical coupling between the first and the second waveguides at a coupling wavelength where the first and the second waveguides are substantially transparent to the optical energy at the coupling wavelength.

56. An integrated tunable optical filter comprising:

a substrate made of a semiconductor material;

a first section on the substrate forming a transmission filter having a low spectral selectivity, the first section including a first waveguide system with a first and a second waveguide, a periodic rib shaped structure adjacent at least one of the waveguides defining a filter response with a coupling wavelength, and thermo-optical organic material having an index of refraction that varies in response to changes in temperature and positioned to shift the coupling wavelength in response to changes of temperature in the thermo-optical organic material positioned to shift the coupling wavelength;

a second section on the substrate forming a reflector with a spectral reflection with a plurality of reflection peaks, the second section including a third waveguide coupled to the first waveguide system in the first section, and thermo-optical organic material having an index of refraction that varies in response to changes in temperature and positioned to shift the plurality of reflection peaks in response to changes in temperature in the thermo-optical organic material positioned to shift the plurality of reflection peaks;

first means for changing the temperature in the first thermo-optical organic material, the filter response of the first section being shifted in wavelength over a range covering a plurality of reflection peaks in the second section; and second means for changing the temperature in the second thermo-optical organic material, the reflection spectrum of the second section being shifted in wavelength and one reflection peak of the plurality of reflection peaks corresponding to the coupling wavelength of the first section;

wherein the optical filter has a reflection response with a narrow bandwidth and wide tunability.

57. The integrated tunable optical filter of claim 56 wherein the first and the second thermo-optical organic material has a coefficient of refractive index variation as a function of temperature, the magnitude of which exceeds $1 \times 10^{-4}/^\circ$ C.

58. The integrated tunable optical filter of claim 56 wherein the thermo-optical organic material is selected from the group comprising a polymer derived from methacrylate, a polymer derived from siloxane, a polymer derived from carbonate, a polymer derived from styrene, a polymer derived from cyclic olefin, and a polymer derived from norbornene.

59. The integrated tunable optical filter of claim 56 wherein the transmission filter is selected from the group comprising of a co-directional grating assisted coupler and a reflective grating assisted coupler.

60. The integrated tunable optical filter of claim 56 wherein the means for changing the temperature in the first and the second thermo-optical organic material is selected from the group comprising a resistive heater, a thermoelectric heater, and a thermoelectric cooler.

* * * * *